(12) United States Patent
Chen et al.

(10) Patent No.: US 11,910,525 B2
(45) Date of Patent: Feb. 20, 2024

(54) THIN FLEXIBLE STRUCTURES WITH SURFACES WITH TRANSPARENT CONDUCTIVE FILMS AND PROCESSES FOR FORMING THE STRUCTURES

(71) Applicant: C3Nano Inc, Hayward, CA (US)

(72) Inventors: Xiaofeng Chen, San Jose, CA (US); Byunghwan Kang, Yongin-si (KR); Jackie Chen, San Leandro, CA (US); Yadong Cao, San Jose, CA (US); Vicki Luo, San Francisco, CA (US); Arthur Yung-Chi Cheng, Newark, CA (US); Andrew Hyeongjoo Moon, Dublin, CA (US); Xiqiang Yang, Hayward, CA (US); Ajay Virkar, San Mateo, CA (US)

(73) Assignee: C3 Nano, Inc., Hayward, CA (US)

( * ) Notice: Subject to any disclaimer, the term of this patent is extended or adjusted under 35 U.S.C. 154(b) by 1159 days.

(21) Appl. No.: 16/259,302

(22) Filed: Jan. 28, 2019

(65) Prior Publication Data

US 2020/0245457 A1     Jul. 30, 2020

(51) Int. Cl.
    *G06F 3/044*     (2006.01)
    *G06F 3/041*     (2006.01)
    (Continued)

(52) U.S. Cl.
    CPC ............ *H05K 1/0393* (2013.01); *G06F 3/044* (2013.01); *G06F 3/0412* (2013.01);
    (Continued)

(58) Field of Classification Search
    CPC ............. H05K 1/097; H05K 2201/026; H05K 2201/0108; H05K 1/0274; G06F 3/0445
    See application file for complete search history.

(56) References Cited

U.S. PATENT DOCUMENTS 8,049,333 B2    11/2011   Alden et al.
8,748,749 B2    6/2014   Srinivas et al.
(Continued)

FOREIGN PATENT DOCUMENTS

CN     105224129 A    †   1/2016
EP     3054374 A1       8/2016
(Continued)

OTHER PUBLICATIONS

Search Report for corresponding Taiwan Patent Application No. 109102669 dated Feb. 25, 2021.
(Continued)

*Primary Examiner* — Paresh Paghadal
(74) *Attorney, Agent, or Firm* — Christensen, Fonder, Dardi PLLC; Elizabeth A. Gallo; Peter S. Dardi

(57) ABSTRACT

Structures are described having thin flexible polymer substrates with electrically conductive films on each opposing surface while having high optical transmittance and good optical properties. The structures can have total thicknesses of no more than about 30 microns and good flexibility. Processing approaches are described that allow for the coating of the very thin structures by providing support through the coating process. The structures are demonstrated to have good durability under conditions designed to test accelerated wear for touch sensor use.

22 Claims, 11 Drawing Sheets

(51) Int. Cl.
  *H05K 1/03* (2006.01)
  *H05K 1/02* (2006.01)
  *H05K 1/11* (2006.01)

(52) U.S. Cl.
  CPC ........... *H05K 1/0298* (2013.01); *H05K 1/118* (2013.01); *B32B 2457/208* (2013.01); *H05K 2201/0108* (2013.01); *H05K 2201/0145* (2013.01)

(56) References Cited

U.S. PATENT DOCUMENTS

| | | | |
|---|---|---|---|
| 9,183,968 | B1 | 11/2015 | Li et al. |
| 9,292,141 | B2 | 3/2016 | Zhong et al. |
| 9,874,814 | B2 | 1/2018 | Yamaoka et al. |
| 9,920,207 | B2 | 3/2018 | Virkar et al. |
| 10,020,807 | B2 | 7/2018 | Virkar et al. |
| 10,029,916 | B2 | 7/2018 | Virkar et al. |
| 10,147,512 | B2 | 12/2018 | Hu et al. |
| 2006/0152782 | A1* | 7/2006 | Noda ................. G02B 27/0103 359/13 |
| 2010/0307792 | A1† | 12/2010 | Allemand |
| 2011/0174190 | A1† | 7/2011 | Sepa |
| 2013/0105770 | A1† | 5/2013 | Pschenitzka |
| 2013/0241871 | A1 | 9/2013 | Huang et al. |
| 2014/0202742 | A1* | 7/2014 | Jones ................. H01L 31/1884 174/253 |
| 2014/0338735 | A1 | 11/2014 | Allemand et al. |
| 2016/0108256 | A1† | 4/2016 | Yang |
| 2016/0293288 | A1* | 10/2016 | Hu ........................... H05K 3/10 |
| 2016/0369104 | A1 | 12/2016 | Gu et al. |
| 2017/0169911 | A1* | 6/2017 | Hu ........................ B22F 1/054 |
| 2017/0345965 | A1* | 11/2017 | Seo ................. H01L 31/022466 |
| 2018/0061521 | A1† | 3/2018 | Praino, Jr. |
| 2018/0105704 | A1 | 4/2018 | Yang et al. |
| 2019/0172602 | A1* | 6/2019 | Hu ..................... H01B 13/0016 |
| 2021/0328162 | A1* | 10/2021 | Fukuda ..................... C08J 5/18 |

FOREIGN PATENT DOCUMENTS

| | | |
|---|---|---|
| JP | 2009-050868 A | 3/2009 |
| JP | 2015-186910 A | 10/2015 |

OTHER PUBLICATIONS

Chang et al., "Highly Foldable Transparent Conductive Films Composed of Silver Nanowire Junctions Prepared by Chemical Metal Reduction", Nanotechnology, 25, (2014).
International Search Report for co-pending application PCT/US20/15218 dated Apr. 27, 2020.
1 Search Report from corresponding European Patent Application No. 20748527.7 dated Oct. 11, 2022.

\* cited by examiner
† cited by third party

| 125 μm HC-PET |
| --- |
| 3M Flexible OCA |
| Overcoat |
| Activegrid™ |
| 15 μm Kolon CPI |
| Activegrid™ |
| Overcoat |
| 3M Flexible OCA |
| 125 μm HC-PET |

FIG. 15

| Black Tape |
| --- |
| 125 μm HC-PET |
| 3M Flexible OCA |
| Overcoat |
| Activegrid™ |
| 15 μm Kolon CPI |
| Activegrid™ |
| Overcoat |
| 3M Flexible OCA |
| 125 μm HC-PET |

THIN FLEXIBLE STRUCTURES WITH SURFACES WITH TRANSPARENT CONDUCTIVE FILMS AND PROCESSES FOR FORMING THE STRUCTURES

FIELD OF THE INVENTION

The invention relates to transparent structures with transparent conductive surfaces that are suitable for incorporation into electrical devices with electrodes associated with light transmitting or light receiving structures, such as transparent touch sensors. The transparent structures can have two transparent conductive surfaces on opposite sides of a thin substrate, such as a polyimide layer. The invention further relates to processes for forming thin, flexible structures with transparent conductive films, which can have transparent conductive films one or more surfaces of a thin, flexible transparent layer.

BACKGROUND OF THE INVENTION

Functional films can provide important functions in a range of contexts. For example, electrically conductive films can be important for the dissipation of static electricity when static can be undesirable or dangerous. Transparent conductive films can be used as electrodes. High quality displays can comprise one or more transparent conductive layers.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic which needs to be deposited using sputtering, a fabrication process that involves high temperatures and vacuum and therefore is relatively slow and not cost effective. Additionally, ITO is known to crack easily on flexible substrates. Newer portable electronic devices are pushing into thinner formats.

SUMMARY OF THE INVENTION

In a first aspect, the invention pertains to a double sided conductive structure comprising a transparent polymer substrate, a sparse metal conductive layer supported on each of the first surface and the second surface of the transparent polymer substrate, and a polymer overcoat over each sparse metal conductive layer. In some embodiments, the transparent polymer substrate can comprises a polymer and having a first surface and a second surface, in which the polymer substrate has an average thickness of no more than about 27 microns and the polymer in a configuration of the transparent polymer substrate has a transmittance from 400 nm to 750 nm of at least about 88% and over the UV spectrum from 330 nm to 375 nm of no more than about 15%. Generally, the polymer overcoat can have an average thickness from about 10 nm to about 200 nm. Each surface of the double sided conductive structure can have a sheet resistance of no more than about 120 Ohms/sq, In a further aspect, the invention pertains to a method for forming a transparent conductive film, the method comprising:

forming a sparse metal conductive layer supported on a first surface of a transparent polymer substrate having an average thickness of no more than about 27 microns, wherein the polymer substrate has a second surface supported on a first polymer release film;

applying a polymer overcoat over the first sparse metal conductive layer;

placing a second polymer release film over the polymer overcoat;

removing the first polymer release film to expose the second surface of the transparent polymer substrate;

forming a second sparse metal conductive layer supported on the second surface of the transparent polymer substrate; and applying a polymer overcoat over the second sparse metal conductive layer.

In another aspect, the invention pertains to a transparent conductive film having an average thickness of no more than about 30 microns and comprising a transparent polymer film having an average thickness of no more than about 27 microns, a sparse metal conductive layer on each side of the transparent polymer film, and a polymer overcoat over each sparse metal conductive layer, in which the polymer overcoat has an average thickness from about 10 nm to about 500 nm. In some embodiments, the transparent conductive film has a sheet resistance of no more than 100 Ohms/sq on each side, a % TT of at least 89%, a haze of no more than 2.5%, and a b* of no more than about 3.5. In additional or alternative embodiments, the double sided conductive structure can be assembled into a test structure with an optically clear adhesive (3M, 8146) and a 125 micron thick PET film over each surface and subjected to accelerated wear testing at 85° C. and 85% relative humidity for 500 hours with an increase in sheet resistance of no more than about 40%.

BRIEF DESCRIPTION OF THE DRAWINGS

FIG. 15 is a schematic section diagram showing a structure with two conductive surfaces without a hardcoat undercoat used for testing samples under an 65 C/90% RH testing conditions.

FIG. 16 is a schematic sectional diagram of a structure used for performing a Xe illumination test of conductive structure.

DETAILED DESCRIPTION OF THE INVENTION

Figure 1:
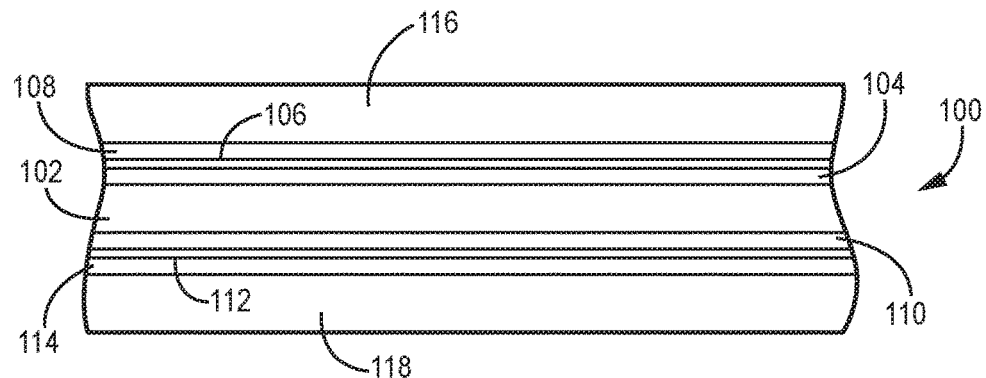
FIG. 1 is a schematic side view of a structure with two sparse metal conductive layers with one on either side of a thin polymer substrate.

A transparent conductive structure with a particularly thin profile and suitable endurance for electronic devices has been designed based on sparse metal conductive layers on opposite sides of a thin transparent polymer substrate selected for particular properties. The transparent conductive structures may be useful for a touch sensor. Selected polymer substrates can have a thickness of no more than about 27 microns while providing good visible light transmittance and good UV absorbing properties. The UV absorbing property provides for independent UV based patterning of the conductive on both sides of the substrate. In some embodiments, a flexible polymer substrate with a hardcoat polymer protective barrier between the conductive layers and the polymer substrate provides particularly durable properties as evaluated using accelerated wear testing. Suitable processing approaches have been developed that make the handling of the very thin substrates practical while performing coating on both sides of the substrates. In the processing, suitable protective polymer films can be used and removed at selected steps of the process to provide stable handling and protection of delicate structures. The design of the double coated structures provides for the independent etching of each surface of the double sided structure, so that patterns can be introduced, for example, based on a touch sensor design.

Transparent conductive films, generally based on indium tin oxide, are in wide spread use for touch sensors or other components in electronic devices. Touch sensor designs generally comprise two electrically conductive elements. One conductive element can be used to reference one dimension in the plane, while the second element can be used to reference a second dimension in the plane to identify a touch point along the plane. Thus, to make touch sensors, generally two patterned conductive films are used, although additional transparent conductive layers can also be used. In general, the touch sensor should be relatively thin, but traditionally each electrically conductive element has been associated with a distinct substrate that are then assembled in a stack. New products have generated a demand for thinner and/or flexible structures. The ability to put both patterned conductive films on a single substrate allows for the formation of thinner and more flexible structures.

The ability to formulate a very thin sensor structure that is flexible can be enabling technology for flexible electronics. For flexible devices with displays having touch sensors, then the conductive elements are transparent. Traditional conductive elements formed from indium tin oxide and similar conductive ceramic oxides are not flexible. The use of sparse metal conductive elements provides the ability to have flexible structures. By putting two transparent conductive films on opposite sides of a single substrate reduces thickness since only a single substrate is needed. Also, very thin substrates have been developed to be suitable for this single substrate. New processing approaches have been developed to allow for the efficient formation of this structure. The ability to form such structures with desirable optical and electronic properties with a very small thickness provides significant challenges, and these challenges are met with excellent results as described herein.

FIG. 1 shows the general structure of a double sided conductive element in a unitary form on a core substrate. Referring to FIG. 1, double sided conductive sheet 100 can comprise substrate polymer sheet 102, optional first hardcoat 104, first sparse metal conductive layer 106, first overcoat 108, optional second hardcoat 110, second sparse metal conductive layer 112, second overcoat 114, optional first releasable protective film 116, and optional second releasable protective film 118. The nature of these materials is important for forming a useable structure with appropriate processing and with suitable stability for commercial use for electronic applications. The materials are described in detail below. The sparse metal conductive layer can be provided effectively as a fused metal nanostructured network.

The formation of a touch sensor can involve the separate patterning of both conductive sides of the double sided conductive structure. In general, the patterning of the conductive layers involve a patterned radiation source, such as a focused laser beam with laser ablation or irradiation through a mask with photolithography using a photoresist. While generally patterning can be performed with various radiation sources, desirable patterning can be performed with a UV laser for ablation or a photoresist that is sensitive to UV light. For laser ablation, a focused UV light, generally from a UV laser, can be scanned across the surface to define the pattern. For photolithography, the UV light is directed through a mask to form a latent image in the photoresist that is then developed to form a physical pattern. The physical pattern in the photoresist then provides for wet or dry etching to transfer the pattern into the sparse metal conductive film. In either case, the two sparse metal conductive layers generally are independently patterned since the different patterns are involved in the function of a touch sensor. For efficient processing, it is desirable for the two sides to be patterned such that the patterning effecting one side does not influence the other side.

To accomplish the two sided independent patterning, for some embodiments, it can be desirable for the substrate to absorb UV light so that a significant flux of UV light from one side does not reach the other side, where it can alter the patterning of the opposite side. On the other hand, the substrate should have high transmittance of visible light. At the same time, the substrate should have suitable mechanical properties at the very small thicknesses involved. The absorption of high energy UV photons may also tend to form reactive species depending on the nature of the UV absorbing composition. To have suitable durability, the sparse metal conductive layer can have protection from any damaging reactive species resulting from the patterning process. As described herein, an optional hardcoat can be located between the substrate and the sparse metal conductive layer to protect the sparse metal conductive layer. As demonstrated in the examples, the optional hardcoat may or may not be used to provide desired stability of the conductive layer.

To provide the desired UV absorbing capability while maintaining high transmittance of visible light and mechanical durability at the desired small thicknesses, polyimide substrates are exemplified below, although other polymer substrates may be used. The polyimide substrate can be selected to provide good transmittance across the visible spectrum while having strong absorption in the ultraviolet. Other polymers besides polyimides with desired properties are also identified below. Processing to form the conductive structure can be performed to form the structure in a commercial roll-to-roll process or similar processing approaches. While the desired structures are very thin, processing approaches have been developed to allow for the appropriate processing.

The structures described herein avoids the use of polymers that have additives in the polymer to absorb UV light or the use of separate layers just to absorb the UV light. Thus, the structures herein are able to maintain a high degree of mechanical stability and stability during use of the conductive layers. The engineering of the structures described herein provide excellent performance in a very thin format that is well suited for foldable touch screen products. Polymers, such as polyimides, with suitable optical properties can provide a high degree of mechanical strength while providing high flexibility.

Other transparent double sided conductive structures have been described in the art. The general patterning of the two sides of a transparent substrate with conductive layers is described in U.S. Pat. No. 9,292,141 to Zhong et al. (hereinafter the '141 patent), entitled "Double Sided Touch Sensor on Transparent Substrate," incorporated herein by reference. The '141 patent is mostly focused on transparent conductive films based on conductive oxides, such as ITO, although it does more broadly refer to transparent conductive films. The double sided patterning of a substrate with nanowire based conductive layers is described in published U.S. patent application 2014/0202742 to Jones et al. (hereinafter the '742 application), entitled "Two-Sided Laser Patterning on Thin Film Substrates," incorporated herein by reference. The '141 patent and the '742 application do not teach the structures described herein with improved mechanical and optical properties based on material engineering and enabled by the processing approaches described herein.

For commercial evaluation, various accelerated wear tests have been developed to test the durability of transparent conductive films. The Examples below provide tests of the double sided transparent conductive films formed as described herein. Some of these accelerated wear tests are similar with slight variations to make the testing somewhat more or less stringent. These tests are widely acknowledged within the industry for testing purposes.

To provide stable processing of the thin double sided conductive structure, the film can be process with stabilization of a releasable polymer carrier film during coating steps. At the end of processing, the final film can be covered on both surfaces by a polymer release layer that can protect the film during transport if further processing is performed remotely or during storage. In general, the various processing steps can be influenced by the order of processing and the location of processing. For practical commercial applications, the double sided conductive film can be processed at one location and transported for patterning and additional processing into the touch sensor, but in principle, processing can be performed at a single physical location.

With the polymer substrate supported by a releasable polymer carrier film, one side of the substrate can be processed to provide an undercoat, a conductive layer with a sparse metal conductive structure and an overcoat layer. The dried overcoat can be covered with a polymer release layer, and then the initial releasable polymer carrier layer can be removed to expose the other side of the substrate with the polymer sheet over the first side overcoat functioning as the carrier layer for the processing of the second side. An undercoat, conductive layer with a sparse metal conductive structure, and an overcoat are applied to the second side of the substrate, generally with the substrate having been flipped over relative to the process equipment to place the side being processed facing upward. If desired, another releasable polymer sheet can be placed over the dried overcoat of the second processed side to complete the structure for storage and/or transport. Various further specific embodiments are discussed below.

The processing improvements and material engineering described herein enables the use of very thin substrates while providing and patterning the two opposing conductive surfaces. Thus, in some embodiments, the completed structure can have a total thickness including the substrate, two conductive layers, undercoats and overcoats, of no more than about 35 microns. The sheet resistance of each of the opposing layers can be no more than about 100 Ohms/sq. The resulting double sided conductive structure can have a total transmission of visible light of at least about 85%, a haze of no more than about 2.5% and b* value of no more than about 4. These properties can be maintained while the overall structure can be very flexible, which is further facilitated by the thinness. Thus, the double sided conductive structure herein is particularly suitable for forming transparent touch sensors for flexible electronic devices.

Figure 2:
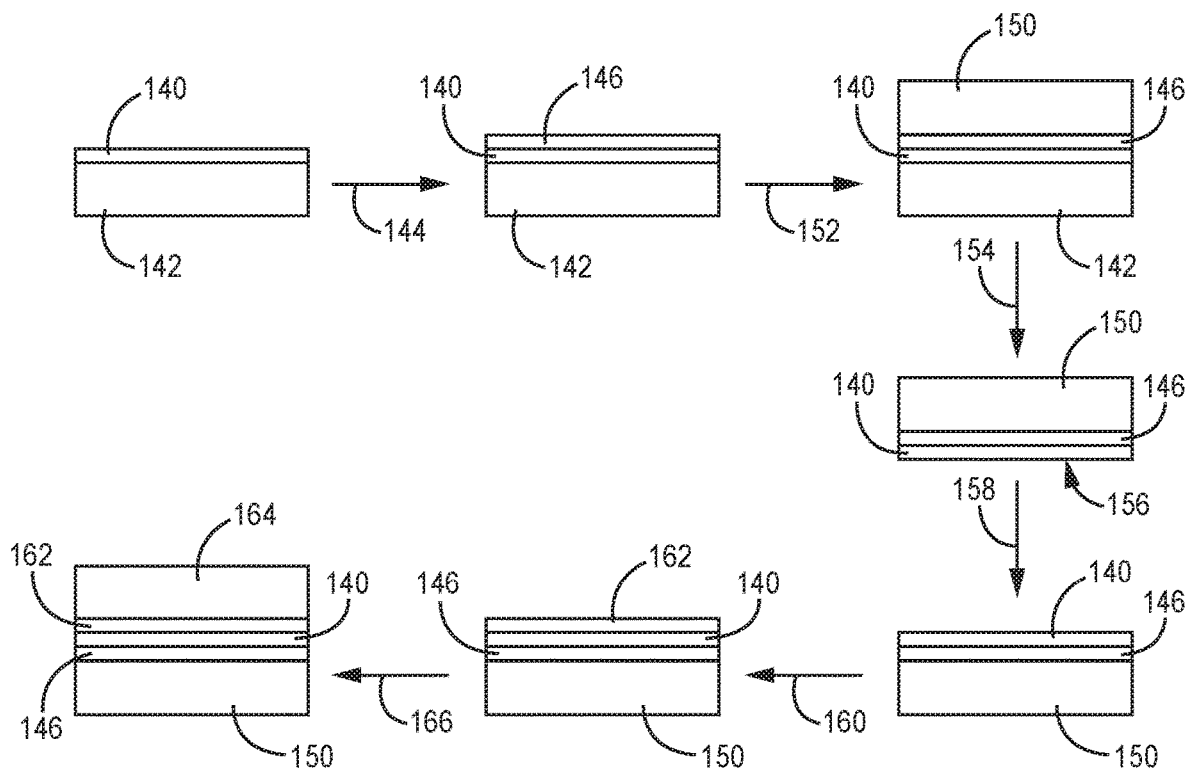
FIG. 2 is a schematic flow diagram of a process to form the structure of FIG. 1.

The basic processing approach involves the use of releasable carrier films to provide for handling of the very thin structures is outlined in FIG. 2, which shows a general process flow. At the start of the depicted flow, a thin substrate 140 is provided with a first releasable carrier layer 142. With first releasable carrier layer 142 covering one surface of the structure, the other surface is processed 144 to form a first transparent conductive coating 146 with a sparse metal conductive layer and any associated layers. After the processing is completed for a first side, a second releasable carrier layer 150 is placed 152 over conductive coating 146. With the structure supported with second releasable carrier layer 150, first releasable carrier layer 142 on the other side can be removed 154 to expose an unprocessed side 156 of thin substrate 140. To facilitate processing it can be optionally flipped 158 in space so that the unprocessed surface is facing upward. The other side of thin substrate 140 is then correspondingly processed 160 to form a second transparent conductive coating 162 on the second side of substrate 140, in which second transparent conductive coating 162 generally has a sparse metal conductive layer and any associated layers. To protect second transparent conductive coating 162 prior to patterning or other further processing, a top releasable carrier film 164 can be placed 166 over second transparent 162. In some embodiments, the completed structure can be rolled up if desired for shipping and or storage.

The processing to form the transparent conductive layer generally comprises the deposition of a nanowire ink, the drying of the nanowire ink, which may result in a fusing to form a fused metal nanostructured network, the deposition of an overcoat, and the drying and curing of the overcoat. This processing can further comprise the deposition of an optional hardcoat as an undercoat between the substrate and the sparse metal conductive layer. As an underlayer, the hardcoat may not provide mechanical protection, but the hardcoat can provide stability of the sparse metal conductive layer presumably from process damage or other interactions from the substrate. The hardcoat generally is transparent to both visible and near UV light.

In general, various sparse metal conductive layers can be formed from metal nanowires. Films formed with metal nanowires that are processed to flatten the nanowires at junctions to improve conductivity is described in U.S. Pat. No. 8,049,333 to Alden et al., entitled "Transparent Conductors Comprising Metal Nanowires," incorporated herein by references. Structures comprising surface embedded metal nanowires to increase metal conductivity are described in U.S. Pat. No. 8,748,749 to Srinivas et al., entitled "Patterned Transparent Conductors and Related Manufacturing Methods," incorporated herein by reference. However, improved properties have been found for fused metal nanostructured networks with respect to high electrical conductivity and desirable optical properties with respect to transparency and low haze. Fusing of adjacent metal nanowires can be performed based on chemical processes under commercially appropriate processing conditions.

In particular, a significant advance with respect to achieving electrically conductive films based on metal nanowires has been the discovery of well controllable processes to form a fused metal network where adjacent sections of the metal nanowires fuse into a unitary structure without distinct nanowires in the conductive network. In particular, it was initially discovered that halide ions can drive the fusing of metal nanowires to form fused metal nanostructures. Fusing agents comprising halide anions were introduced in various ways to successfully achieve the fusing with a corresponding significant drop in the electrical resistance. It should be noted that halide ions in this processing context should not be confused with halide ions used in the nanowire synthesis reactions. Specifically, the fusing of metal nanowires with halide anions has been accomplished with vapors and/or solutions of acid halides as well as with solutions of halide salts. Fusing of metal nanowires with halide sources is described further in U.S. Pat. No. 10,029,916 to Virkar et al., entitled "Metal Nanowire Networks and Transparent Conductive Material," and U.S. Pat. No. 9,920,207 to Virkar et al. (the '207 patent), entitled "Metal Nanostructured Networks and Transparent Conductive Material," both of which are incorporated herein by reference.

An extension of the process for forming fused metal nanowire networks was based on reduction/oxidation (redox) reactions that can be provided to result in fused nanowires without destroying the optical properties of the resulting film. Metal for deposition at the junctions can be effectively added as a dissolved metal salt or can be dissolved from the metal nanowires themselves. The effective use of redox chemistry for fusing metal nanowires into a nanostructured network is described further in U.S. Pat. No. 10,020,807 to Virkar et al. (the '807 patent), entitled "Fused Metal Nanostructured Networks, Fusing Solutions with Reducing Agents and Methods for Forming Metal Networks," incorporated herein by reference. The '807 patent also described a single solution approach for the formation of fused metal nanostructured networks. Single solution approaches for the formation of fused metal nanostructured layers are described further in U.S. Pat. No. 9,183,968 B1 to Li et al, (hereinafter the '968 patent) entitled "Metal Nanowire Inks for the Formation of Transparent Conductive Films with Fused Networks," incorporated herein by reference, and single solution or ink processing to form fused metal nanostructured networks is used in the Examples below.

The desirable inks to achieve effective single deposition inks that cure into fused nanostructured metal networks comprise a desired amount of metal nanowires to achieve appropriate loading of metal in the resulting film. In appropriate solutions, the inks are stable prior to deposition of the ink and drying. The inks can comprise a reasonable amount of polymer binder that contributes to the formation of a stable conducting film for further processing. To obtain good fusing results with one ink systems, hydrophilic polymers have been found to be effective, such as cellulose or chitosan based polymers. Metal ions, as a source of metal for the fusing process, can be supplied as a soluble metal salt.

A single ink formulation provides for depositing a desired loading of metal as a film on the substrate surface and simultaneously providing constituents in the ink that induce the fusing process as the ink is dried under appropriate conditions. These inks can be referred to conveniently as fusing metal nanowire inks with the understanding that the fusing generally does not take place until drying. The inks generally comprise an aqueous solvent, which can further comprise an alcohol and/or other organic solvent in some embodiments. The inks can further comprise dissolved metal salts as a metal source for the fusing process. Without wanting to be limited by theory, it is believed that components of the ink, e.g., alcohol, or other organic compositions, reduce the metal ions from solution to drive the fusing process. Previous experience with the fusing process in these systems suggests that the metal preferentially deposits at the junctions between adjacent metal nanowires. A polymer binder can be provided to stabilize the film and to influence ink properties. The particular formulation of the ink can be adjusted to select ink properties suitable for a particular deposition approach and with specific coating properties on a substrate surface. As described further below, drying conditions can be selected to effectively perform the fusing process. Two solution fusing systems have also been established and can take advantage of the improved silver nanowires described herein.

The double sided conductive films can be appropriately patterned for incorporation into devices, such as touch sensors. For patterning, any protective release layer can be removed to expose the overcoat. The overcoat is thin, and the patterning generally involved corresponding patterning of the overcoat with the conductive layer. The patterned film can be cut to a desired size. For assembly into a device, optically clear adhesives can be applied to the patterned conductive film to attach the film to the device. Along the edge of the film the transparent conductive structure can be connected to metal traces to integrate the transparent conductor into a circuit. Another portion of optically clear adhesive can provide a protective cover to the device, which can be a flexible polymer sheet for desired flexible devices. The thin, flexible nature of the double coated structure described herein provides a significant advance for certain device applications.

Double Sided, Separately Patternable Electrically Conductive Structures

The electrically conductive structures herein comprise electrically conductive layers on opposing surfaces that can provide separate conductive features for integration, into electrical devices, such as touch sensors. The substrate is selected to have good transmission of visible light and good absorption of ultraviolet light. Suitable polymers are described with mechanical properties at small thicknesses suitable for flexible structures, which can have high durability. The structures also can have good stability of the conductivity under accelerated wear testing conditions at elevated temperatures and humidity levels. In some embodiments, the total structure including protective polymer overcoats can have a total average thickness of no more than about 30 microns, which is desirable to form thinner final products as well as flexible displays with appropriate mechanical properties. The double sided conductive structures described herein have achieved suitable flexibility for foldable electronics at a commercial level assembled into an actual display device, and based on the testing for these applications, the double sided conductive structures with overcoats on both surfaces can be bent around a 1 mm diameter mandrel repeatedly for at least 200,000 times with the sheet resistance of the conductive surfaces changing by no more than 10%. Experience strongly suggests that such bending can be performed for at least several million bends.

The basic structure is shown in FIG. 1 above. The polymer substrate is the core of the structure both literally since the conductive layers applied to both sides, and in some sense figuratively since it provides the majority of the thickness of the structure. The polymer comprises a polymer as a majority component, generally at least over 50 weight percent, which can be referred to as the substrate polymer. Suitable substrate polymers are transparent to visible light. Specifically, the transmittance of the substrate polymer generally is at least about 88%, in some embodiments at least about 89%, in additional embodiments at least about 90% and in further embodiments at least about 91%. Optical properties of the overall structure and measurement of optical properties are discussed in more detail below, and the relevant general discussion provided below in more detail applies equally here. Also, for the selected thickness of the substrate (the transmission properties are thickness dependent), the substrate polymer absorbs UV light with a wavelength from 330 nm to 370 nm such that the transmittance over this wavelength range is no more than about 15%, in further embodiments no more than about 10%, in additional embodiments no more than about 5%, and in other embodiments no more than about 2%. The polymer substrates generally can have average thicknesses of no more than about 27 microns, in further embodiments from about 1 micron to about 25 microns, and in other embodiments from about 5 microns to about 23 microns, although in some embodiments useful substrates can have a thickness from about 5 microns to about 60 microns. A person of ordinary skill in the art will recognize that additional ranges transmittance and thicknesses within the explicit ranges above are contemplated and are within the present disclosure.

Suitable polymers include, for example, polyimides, polysulfide (such as Pylux™, Ares Materials), polysulfone (such as Udel® from Solvay), or polyethersulfone (such as Veradel® from Solvay or Ultrason® from BASF), and polyethylene naphthalate (such as Teonex® from DuPont). Examples are presented below based on transparent polyimides. Traditional aromatic polyimides are colored. But recently developed polyimides are transparent to visible light. The transparent polyimides absorb ultra violet light. Transparent polyimides are available from Kolon (Korea), Taimide Tech. (Taiwan), Sumitomo (Japan), SKC Inc. (GA, USA) and NeXolve (AL, USA)

The use of a substrate polymer that itself absorbs UV light avoids the use of either separate layers of UV absorbing agents or a UV filler in the polymer. The use of separate layers of UV absorbing agents would increase the thickness of the structure and alter the mechanical properties. The use of a UV absorber as a filler in the polymer substrate can alter the mechanical and chemical properties of the polymer substrate. The structures herein rely on the UV absorbing properties of the substrate polymer to achieve highly desired properties of the structure. Proposals have been made for the use of polyesters with a UV absorbing filler. See published U.S. patent application 2014/0202742 to Jones et al., entitled "Two-Sided Laser Patterning on Thin Film Substrates," incorporated herein by reference. The use of fillers can alter the stability and mechanical properties.

For use in flexible displays, it is desirable for the polymer substrate to have desirable mechanical properties. The durability of the material can be expressed in some sense by the elongation, which is a measure of the extent that the material can be stretch without breaking, and/or tensile strength, which is a measure of the force that can be applied before a material fails. Elongation is generally provided by the polymer manufacturer as measured by a standardized procedure, generally ASTM D882. In some embodiments, it is desirable for the elongation to be at least about 10%, in further embodiments at least about 15% and in other embodiments from about 20% to about 100%. In some embodiments, the tensile strength of the substrate can be at least about 50 MPa, in further embodiments at least about 60 MPa, and in some embodiments from about 65 MPa to about 300 MPa. Also, for some applications, the elastic (Young's) modulus of the substrate polymer can be from about 1.5 GPa to about 7.0 GPa, in further embodiments from about 1.75 GPa to about 6.5 GPa, and in other embodiments from about 2.0 GPa to about 6 GPa. A person of ordinary skill in the art will recognize that additional ranges of elongation, tensile strength, and modulus within the explicit ranges above are contemplated and are within the present disclosure.

The electrical conductivity on the two sides of the structure is provided by a sparse metal conductive layer. Sparse metal conductive layers are discussed in more detail in the following section. Generally, the thickness of these layers is very small since the thickness of the nanowires may be on the order of 10-25 nanometers (nm), and in the future somewhat thinner nanowires may be available. The sparse metal conductive layer can be a fused metal nanostructured network that is formed through the fusing of initially deposited metal nanowires unto a unitary transparent metal structure. Following the work of the present Applicant, fused metal nanostructured networks have been studied by academic research laboratories. The bending stability of transparent conductive layers on polymer substrates has been evaluated. See Cheng et al., "Highly foldable transparent conductive films composed of silver nanowire junctions prepared by chemical metal reduction, Nanotechnology 25 (2014) 285601 (7 pages)(hereinafter Cheng et al.). Using less desirable techniques for fusing silver nanowires, it was none the less found that fusing provided significant bending stability for the resulting transparent conductive film. Specifically, Cheng et al. determined that the fused metal nanostructured network was much more stable in a structure repeatedly bent relative to a corresponding structure that was not fused. It is believed that the use of a fused metal nanostructured network is significant for obtaining a structure with long use stability for a flexible display.

The sparse metal conductive layers are generally covered with a polymer overcoat to provide mechanical protection to the conductive layer. In some embodiments, it may be possible to select an overcoat such that after application of the overcoat, the haze is significantly reduced without significantly degrading other properties. Also, the thickness and compositions of the overcoat can be selected such that the sheet resistance measurement through the overcoat is not significantly altered relative to the measurement without the overcoat. Suitable commercial coating compositions for overcoats include, for example, coating solutions POSS® Coatings from Hybrid Plastics, Inc. (Mississippi, USA), silica filled siloxane coatings from California Hardcoating Company (California, USA), Acier® Hybrid Hard Coating Material from Nidek (Japan), SK1100 Series Hard Coat from Dexerials Corporation (Japan), Lioduras™ from TOYOCHEM (Japan), HC-5619 Hard Coat from Addison Clear Wave (IL, USA), CrystalCoat UV-curable coatings from SDC Technologies, Inc. (California, USA). The incorporation of stabilizers into overcoats is described in copending U.S. patent application Ser. No. 15/730,053 to Yang et al., entitled "Stabilized Sparse Metal Conductive Films and Solutions for Delivery of Stabilizing Compounds," incorporated herein by reference.

The overcoat layers, one over each of the two sparse metal conductive layers, are generally thin enough so that electrical conductivity can take place through the overcoat, even though the overcoat polymers are generally dielectric. In other words, the surface with the overcoat should generally have roughly the same sheet resistance as the surface without the overcoat. Thus, it can be desirable for the polymer overcoat to have an average thickness of no more than about 250 nm, in some embodiments from about 5 nm to about 200 nm, and in further embodiments from about 10 nm to about 175 nm. A person of ordinary skill in the art will recognize that additional ranges of thicknesses within the explicit ranges above are contemplated and are within the present disclosure.

As noted above, the conductive structure can comprise underlayers between the polymer substrate and the sparse metal conductive layer. The underlayer can comprise a polymer hardcoat. As an underlayer the polymer hardcoat does not provide mechanical protection, but a polymer hardcoat can provide protection from chemical assaults. As described in the examples, a polymer hardcoat underlayer provides significant stability for a fused metal nanostructured layer for some polymer substrates, although for some similar thicker substrates, the undercoat was not used to obtain satisfactory stability. It is not yet understood why some structures were sufficiently stable without the hardcoat.

Suitable hardcoat polymers are generally highly crosslinked polymers with crosslinked polyacrylates that can be combined with other crosslinked moieties, such as polyurethanes, epoxy polymers, polysiloxanes and/or other crosslinked polymers. Branched acrylate monomers can provide for the formation of highly crosslinked polymers, and crosslinked acrylates can be copolymerized with other moieties, such as urethane acrylates, or the like to form intermeshed crosslinked polymers. Hardcoat polymers are commercially available, such as coating solutions from POSS® Coatings from Hybrid Plastics, Inc. (Mississippi, USA), silica filled siloxane coatings from California Hardcoating Company (California, USA), Acier® Hybrid Hard Coating Material from Nidek (Japan), SK1100 Series Hard Coat from Dexerials Corporation (Japan), Lioduras™ from TOYOCHEM (Japan), HC-5619 Hard Coat from Addison Clear Wave (IL, USA), CrystalCoat UV-curable coatings from SDC Technologies, Inc. (California, USA). Hardcoat polymers are described further in published U.S. patent application 2016/0369104 to Gu et al., entitled "Transparent Polymer Hardcoats and Corresponding Transparent Films," incorporated herein by reference.

Suitable hard coat polymers are available that are highly transparent for the relevant thicknesses such that the hardcoats do not significantly reduce the light transmission through the structure. The polymer hardcoat layers can each have independently average thicknesses from about 250 nm to about 4 microns, in further embodiments from about 400 nm to about 3.5 microns, and in other embodiments from about 500 nm to about 3 microns. A person of ordinary skill in the art will recognize that additional ranges of hardcoat thicknesses within the explicit ranges above are contemplated and are within the present disclosure.

The final structure has a crosslinked overcoat layer on each surface that each provide a relatively non-tacky surface. To protect the structure for shipping, storage or the like, one or both surfaces can be protected with a releasable polymer layer. The releasable polymer layer can be formed with a thickness from about 15 microns to about 200 microns, in further embodiments from about 20 microns to about 180 microns, in other embodiments from about 25 microns to about 170 microns and in additional embodiments from about 40 microns to about 150 microns. A person of ordinary skill in the art will recognize that additional ranges of thicknesses within the explicit ranges above are contemplated and are within the present disclosure. A range of suitable non-tacky polymers can be used for the polymer release layer, and the optical properties are not relevant since the release layers are removed for further processing. Suitable polymers include, for example, polyethylene, polypropylene, polyesters, polyamides, polysiloxanes, copolymers thereof, and the like. The particular polymers should be selected to have low tackiness, such that the peel strength of the release layer should be sufficiently low that the materials are not damaged when the release layer is peeled away from the substrate.

Sparse Metal Conductive Layers

Sparse metal conductive layers are generally formed from metal nanowires. With sufficient loading and selected nanowire properties, reasonable electrical conductivity can be achieved with the nanowires with corresponding appropriate optical properties. It is expected that transparent conductive film structures formed with silver nanowires can yield desirable performance for double sided conductive films having structures described herein with various sparse metal conductive structures. However, particularly desirable properties have been achieved with fused metal nanostructured networks. The discussion herein focuses on embodiments involving fused metal nanostructured networks that have been found to provide improved performance properties as transparent conductive films.

Several practical approaches have been developed to accomplish the metal nanowire fusing. The metal loading can be balanced to achieve desirable levels of electrical conductivity with good optical properties. In general, the metal nanowire processing can be accomplished through deposition of two inks with the first ink comprising the metal nanowires and the second ink comprising a fusing composition, or through the deposition of an ink that combines the fusing elements into the metal nanowire dispersion. The inks may or may not further comprise additional processing aids, binders or the like. Suitable patterning approaches can be selected to be suitable for the particular ink system.

In general, one or more solutions or inks for the formation of the metal nanostructured network can collectively comprise well dispersed metal nanowires, a fusing agent, and optional additional components, for example, a polymer binder, a crosslinking agent, a wetting agent, e.g., a surfactant, a thickener, a dispersant, other optional additives or combinations thereof. The solvent for the metal nanowire ink and/or the fusing solution if distinct from the nanowire ink can comprise an aqueous solvent, an organic solvent or mixtures thereof. In particular, suitable solvents include, for example, water, alcohols, ketones, esters, ethers, such as glycol ethers, aromatic compounds, alkanes, and the like and mixtures thereof. Specific solvents include, for example, water, ethanol, isopropyl alcohol, isobutyl alcohol, tertiary butyl alcohol, methyl ethyl ketone, glycol ethers, methyl isobutyl ketone, toluene, hexane, ethyl acetate, butyl acetate, ethyl lactate, PGMEA (2-methoxy-1-methylethylacetate), dimethyl carbonate, or mixtures thereof. While the solvent should be selected based on the ability to form a good dispersion of metal nanowires, the solvents should also be compatible with the other selected additives so that the additives are soluble in the solvent. For embodiments in which the fusing agent is included in a single solution with the metal nanowires, the solvent or a component thereof may or may not be a significant component of the fusing solution, such as alcohols and can be selected accordingly if desired.

The metal nanowire ink, in either a one ink or two ink configuration, can include from about 0.01 to about 1 weight percent metal nanowires, in further embodiments from about 0.02 to about 0.75 weight percent metal nanowires and in additional embodiments from about 0.04 to about 0.5 weight percent metal nanowires. A person of ordinary skill in the art will recognize that additional ranges of metal nanowire concentrations within the explicit ranges above are contemplated and are within the present disclosure. The concentration of metal nanowires influences the loading of metal on the substrate surface as well as the physical properties of the ink.

Silver provides excellent electrical conductivity. The present applicant markets a suitable silver nanowire ink for forming fused metal nanostructured networks under the tradename Activegrid™ ink. Other silver nanowire sources are commercially available, and the basic fusing technology is well described in the '207 and '807 patents cited above.

Polymer binders and the solvents are generally selected consistently such that the polymer binder is soluble or dispersible in the solvent. In appropriate embodiments, the metal nanowire ink generally comprises from about 0.02 to about 5 weight percent binder, in further embodiments from about 0.05 to about 4 weight percent binder and in additional embodiments from about 0.1 to about 2.5 weight percent polymer binder. In some embodiments, the polymer binder comprises a crosslinkable organic polymer, such as a radiation crosslinkable organic polymer and/or a heat curable organic binder. To facilitate the crosslinking of the binder, the metal nanowire ink can comprise in some embodiments from about 0.0005 wt % to about 1 wt % of a crosslinking agent, in further embodiments from about 0.002 wt % to about 0.5 wt % and in additional embodiments from about 0.005 wt % to about 0.25 wt %. The nanowire ink can optionally comprise a rheology modifying agent or combinations thereof. In some embodiments, the ink can comprise a wetting agent or surfactant to lower the surface tension, and a wetting agent can be useful to improve coating properties. The wetting agent generally is soluble in the solvent. In some embodiments, the nanowire ink can comprise from about 0.001 weight percent to about 1 weight percent wetting agent, in further embodiments from about 0.002 to about 0.75 weight percent and in other embodiments from about 0.003 to about 0.6 weight percent wetting agent. A thickener can be used optionally as a rheology modifying agent to stabilize the dispersion and reduce or eliminate settling. In some embodiments, the nanowire ink can comprise optionally from about 0.05 to about 5 weight percent thickener, in further embodiments from about 0.075 to about 4 weight percent and in other embodiments from about 0.1 to about 3 weight percent thickener. A person of ordinary skill in the art will recognize that additional ranges of binder, wetting agent and thickening agent concentrations within the explicit ranges above are contemplated and are within the present disclosure.

A range of polymer binders can be suitable for dissolving/dispersing in a solvent for the metal nanowires, and suitable binders include polymers that have been developed for coating applications. Hard coat polymers, e.g., radiation curable coatings, are commercially available, for example, as hard coat materials for a range of applications, that can be selected for dissolving in aqueous or non-aqueous solvents. Suitable classes of radiation curable polymers and/or heat curable polymers include, for example, polyurethanes, acrylic resins, acrylic copolymers, cellulose ethers and esters, other water insoluble structural polysaccharides, polyethers, polyesters, epoxy containing polymers, and mixtures thereof. Examples of commercial polymer binders include, for example, NEOCRYL® brand acrylic resin (DMS NeoResins), JONCRYL® brand acrylic copolymers (BASF Resins), ELVACITE® brand acrylic resin (Lucite International), SANCURE® brand urethanes (Lubrizol Advanced Materials), cellulose acetate butyrate polymers (CAB brands from Eastman™ Chemical), BAYHYDROL™ brand polyurethane dispersions (Bayer Material Science), UCECOAT® brand polyurethane dispersions (Cytec Industries, Inc.), MOWITOL® brand polyvinyl butyral (Kuraray America, Inc.), cellulose ethers, e.g., ethyl cellulose or hydroxypropyl methyl cellulose, other polysaccharide based polymers such as chitosan and pectin, synthetic polymers like polyvinyl acetate, and the like. In particular, polysaccharide based polymers has been found to be desirable as binders in sparse metal conductive layers. The polymer binders can be self-crosslinking upon exposure to radiation, and/or they can be crosslinked with a photoinitiator or other crosslinking agent. In some embodiments, photocrosslinkers may form radicals upon exposure to radiation, and the radicals then induce crosslinking reactions based on radical polymerization mechanisms. Suitable photoinitiators include, for example, commercially available products, such as IRGACURE® brand (BASF), GENOCURE™ brand (Rahn USA Corp.), and DOUBLECURE® brand (Double Bond Chemical Ind., Co, Ltd.), combinations thereof or the like.

Wetting agents can be used to improve the coatability of the metal nanowire inks as well as the quality of the metal nanowire dispersion. In particular, the wetting agents can lower the surface energy of the ink so that the ink spreads well onto a surface following coating. Wetting agents can be surfactants and/or dispersants. Surfactants are a class of materials that function to lower surface energy, and surfactants can improve solubility of materials. Surfactants generally have a hydrophilic portion of the molecule and a hydrophobic portion of the molecule that contributes to its properties. A wide range of surfactants, such as nonionic surfactants, cationic surfactant, anionic surfactants, zwitterionic surfactants, are commercially available. In some embodiments, if properties associated with surfactants are not an issue, non-surfactant wetting agents, e.g., dispersants, are also known in the art and can be effective to improve the wetting ability of the inks. Suitable commercial wetting agents include, for example, COATOSIL™ brand epoxy functionalized silane oligomers (Momentum Performance Materials), SILWET™ brand organosilicone surfactant (Momentum Performance Materials), THETAWET™ brand short chain non-ionic fluorosurfactants (ICT Industries, Inc.), ZETASPERSE® brand polymeric dispersants (Air Products Inc.), SOLSPERSE® brand polymeric dispersants (Lubrizol), Capstone® fluorosurfactants (DuPont™), XOANONS WE-D545 surfactant (Anhui Xoanons Chemical Co., Ltd), EFKA™ PU 4009 polymeric dispersant (BASF), MASURF FP-815 CP, MASURF FS-910 (Mason Chemicals), NOVEC™ FC-4430 fluorinated surfactant (3M), mixtures thereof, and the like.

Thickeners can be used to improve the stability of the dispersion by reducing or eliminating settling of the solids from the metal nanowire inks. Thickeners may or may not significantly change the viscosity or other fluid properties of the ink. Suitable thickeners are commercially available and include, for example, CRAYVALLAC™ brand of modified urea such as LA-100 (Cray Valley Acrylics, USA), polyacrylamide, THIXOL™ 53 L brand acrylic thickener, COAPUR™ 2025, COAPUR™ 830 W, COAPUR™ 6050, COAPUR™ XS71 (Coatex, Inc.), BYK® brand of modified urea (BYK Additives), Acrysol DR 73, Acrysol RM-995, Acrysol RM-8W (Dow Coating Materials), Aquaflow NHS-300, Aquaflow XLS-530 hydrophobically modified polyether thickeners (Ashland Inc.), Borchi Gel L 75 N, Borchi Gel PW25 (OMG Borchers), and the like.

Additional additives can be added to the metal nanowire ink, generally each in an amount of no more than about 5 weight percent, in further embodiments no more than about 2 weight percent and in further embodiments no more than about 1 weight percent. Other additives can include, for example, anti-oxidants, UV stabilizers, defoamers or anti-foaming agents, anti-settling agents, viscosity modifying agents, or the like.

Processing to form the fused metal nanostructured layer is described below.

Optical and Electrical Properties of Double Sided Structure

Transparent structures with double sided conductive films incorporating sparse metal conductive layers, e.g., fused metal nanostructured networks, can provide low electrical resistance while providing good optical properties. Thus, the films can be useful as transparent conductive electrodes or the like. The transparent conductive electrodes can be suitable for a range of applications. For displays and in particular for touch screens, the films can be patterned independently on each side to provide electrically conductive patterns formed by the film. The double sided conductive structures generally has good optical properties with respect to high transmittance, low haze and low color.

Electrical resistance of thin films can be expressed as a sheet resistance, which is reported in units of ohms per square ($\Omega/\square$ or ohms/sq) to distinguish the values from bulk electrical resistance values according to parameters related to the measurement process. Sheet resistance of films is generally measured using a four point probe measurement or another suitable process. In some embodiments, each conductive surface of the structure can have a sheet resistance of no more than about 200 ohms/sq, in further embodiments no more than about 150 ohms/sq, in additional embodiments no more than about 100 ohms/sq and in other embodiments no more than about 75 ohms/sq. A person of ordinary skill in the art will recognize that additional ranges of sheet resistance within the explicit ranges above are contemplated and are within the present disclosure. In the Examples, transparent conductive films are formed with target sheet resistances of 50 ohms/sq. In general, sheet resistance can be reduced by increasing the loading of nanowires, but an increased loading may or may not be desirable from other perspectives.

For applications as transparent conductive films, it is desirable for the fused metal nanowire networks or other sparse metal conductive layer to maintain good optical transparency. In principle, optical transparency is inversely related to the metal loading with higher loadings leading to a reduction in transparency, although processing of the network can also significantly affect the transparency. Also, polymer binders and other additives can be selected to maintain good optical transparency. Transparency can be reported in terms of a dimensionless quantity, transmittance. Transmittance is the ratio of the transmitted light intensity (I) to the incident light intensity ($I_o$). Transmittance is reported in the Examples below for the transparent conductive layer within the double sided conductive structure with the overcoat layers. The optical transmittance of the transparent conductive layer can be evaluated relative to the transmitted light through the substrate supporting the transparent conductive film. For example, the transparency of the conductive layer described herein can be measured by using a UV-Visible spectrophotometer and measuring the total transmission through the conductive layer and support substrate. Transmittance values are reported for the transparent conductive layers on the transparent film substrates. The transmittance through the individual layers can be estimated through the measurement of various intermediates, if desired, based on the total transmittance being approximately the product of the individual transmittances.

While it is generally desirable to have good optical transparency across the visible spectrum, for convenience, optical transmission can be reported at 550 nm wavelength of light. Alternatively or additionally, transmission can be reported as total transmittance from 400 nm to 700 nm wavelength of light, and such results are reported in the Examples below. In general, for the fused metal nanowire films, the measurements of 550 nm transmittance and total transmittance from 400 nm to 700 nm (or just "total transmittance" for convenience) are not qualitatively different. In some embodiments, the double sided conductive structure has a total transmittance (TT %) of at least 85%, in further embodiments at least about 88%, in additional embodiments, at least about 89%, in other embodiments from about 90% to about 96%, and in some embodiments from about 90.5% to about 95%. Transmittance of the films can be evaluated using the standard ASTM D1003 ("Standard Test Method for Haze and Luminous Transmittance of Transparent Plastics"), incorporated herein by reference. A person or ordinary skill in the art will recognize that additional ranges of transmittance within the explicit ranges above are contemplated and are within the present disclosure.

The fused metal networks can also have low haze along with high transmission of visible light while having desirably low sheet resistance. Haze can be measured using a haze meter based on ASTM D1003 referenced above, and the haze contribution of the substrate can be removed to provide haze values of the transparent conductive film. Haze as measured based on ASTM D1003 is a transmission based haze, and separate measurements can be made for reflection based haze. Unless explicitly indicated otherwise, haze refers to transmission based haze. In some embodiments, the transparent conductive film can have a haze value of no more than about 2.5%, in further embodiments no more than about 2.25%, in additional embodiments no more than about 2.0% and in other embodiments from about 0.6% to about 1.75%. It has been found that selected transparent overcoats can significantly reduce the haze from the structure with the transparent conductive layer, and the values of the structure with the overcoat can be considered with respect to these ranges of haze values. Polymer overcoats are discussed above. A person of ordinary skill in the art will recognize that additional ranges of haze within the explicit ranges above are contemplated and are within the present disclosure.

It can also be desirable for the double sided conductive structures to be essentially white, i.e., having little color. Color spaces can be defined to relate spectral wavelengths to human perception of color. CIELAB is a color space determined by the International Commission on Illumination (CIE). The CIELAB color space uses a three-dimensional set of coordinates, L*, a* and b*, where L* relates to the lightness of the color, a* relates to the position of the color between red and green, and b* relates to the position of the color between yellow and blue. The "*" values represent normalized values relative to a standard white point. These CIELAB parameters can be determined using commercial software from measurements made in a spectrophotometer.

Based on CIELAB parameters, in principle, the double sided conductive structures with appropriate polymer substrates can be designed to get a reasonable degree of whiteness, generally based on a small absolute value of b* and a* in the CIELAB scale. In some embodiments, in view of practical limitations, design of the films can direct the results to produce whiter light within certain desired ranges (absolute values of b* and a* lower than target cutoff values), as has been achieved with nanoscale colorants. As explained further below, reasonable values of whiteness can be obtained with acceptable decreases in total transmission of visible light. In some embodiments, the double sided conductive structures can have a value of b* of no more than about 4.0, in further embodiments no more than about 3.75, and in other embodiments no more than about 3.5, although lower values may be possible with appropriate selection of the substrate, which contributes most of the b* value.

Nanoscale colorants can be, for example, nanoscale metal structures or nanoscale pigments. Nanoscale metal structures generally have at least one average dimension that is no more than about 100 nm. For example, nanoplates have an average thickness of no more than 100 nm, nanoribbons can have a thickness of no more than about 100 nm and possibly a width of no more than 100 nm. Metal nanoplates can be synthesized using solution based techniques and their optical properties have been examined. Silver nanoplates with tuned absorption properties based on surface plasmon resonances are available commercially from nanoComposix, Inc., San Diego, CA, USA, Beijing Nanomeet Technology Co. Ltd., China, and Suzhou ColdStones Technology Co., Ltd., China. Larger scale silver nanoplate synthesis has been described in U.S. Pat. No. 10,147,512 to Hu et al., entitled "Methods for Synthesizing Silver Nanoplates and Noble Metal Coated Silver Nanoplates and Their Use in Transparent Films for Hue Control," incorporated herein by reference.

Processing

Processing approaches have been developed to allow for the reproducible formation of the double sided conductive structures with the thin dimensions described herein. In some embodiments, the structures are formed sequentially one side at a time. While one side is being processed, the other side of the structure is generally supported on a release layer, such as the polymer release layers described above. The processing can generally be conceptualized, conveniently although somewhat arbitrarily, broken down into five components: 1) preparing the substrate for processing, 2) processing a first side, 3) preparing the structure for processing the second side, 4) processing the second side, and 5) completing structure for shipping and/or storage.

In preparing the structure for coating, the substrate is procured and provided on a release layer on one side with the opposite surface exposed for coating. The substrate sheet is generally symmetric so that either surface can be selected to be the first surface for processing. The release layer used to support the substrate for processing should be selected to have a thermal stability suitable for processing, which generally means that the melting point should be greater than roughly 180° C. For some polymer substrate materials, the glass transition temperature ($T_g$) may also be significant. It can be desirable in some embodiments for $T_g$ to be at least about 100° C., and in further embodiments $T_g$ can be at least about 120° C. If the substrate supplier provides the substrate without a release layer or on a release layer that does not have the desired thermal stability, the substrate is placed on a suitable thermally stable release layer and, if appropriate, an initially supplied release layer is removed to expose the first surface for coating. The substrate film on the thermally stable release layer is then ready for processing. Suitable release layer sheets are described above.

For embodiments with a hardcoat, the undercoat can be formed next on the exposed surface. In some embodiments with a hardcoat, the substrate supplier may provide the substrate already with a hardcoat, so that the hardcoat can be assumed to be part of the substrate solely from a process perspective. For the deposition of a hardcoat precursor solution, any reasonable deposition approach can be used, such as dip coating, spray coating, knife edge coating, bar coating, Meyer-rod coating, slot-die coating, gravure printing, spin coating or the like. The deposition approach directs the amount of liquid deposited, and the concentration of the solution can be adjusted to provide the desired thickness of product coating on the surface. After forming the coating with the dispersion, the coating can be dried to remove the liquid and crosslinked appropriately. Drying can be performed in any reasonable way, such as exposure to ambient, heating in an oven, blowing warm air across the coated structure, using a heat lamp, combinations thereof, or the like. Generally, the hardcoats are crosslinked with UV light or with heat, and a crosslinking initiator may or may not be used.

Whether or not a hardcoat is applied, a sparse metal conductive layer is then applied. In some embodiments, a process is used in which a sparse nanowire film is initially deposited, and further processing may or may not involve the fusing of the silver nanowires. As noted above, the fusing into a unitary fused metal nanostructured network can provide improved properties of the transparent conductive film. For the deposition of the metal nanowire ink, any reasonable deposition approach can be used, such as dip coating, spray coating, knife edge coating, bar coating, Meyer-rod coating, slot-die coating, gravure printing, spin coating or the like. The ink can have properties, such as viscosity, adjusted appropriately with additives for the desired deposition approach. Similarly, the deposition approach directs the amount of liquid deposited, and the concentration of the ink can be adjusted to provide the desired loading of metal nanowires on the surface. After forming the coating with the dispersion, the sparse metal conductive layer can be dried to remove the liquid.

Fusing of the metal nanowires can be accomplished through various agents. Without wanting to be limited by theory, the fusing agents are believed to mobilize metal ions, and the free energy seems to be lowered in the fusing process. Excessive metal migration or growth may lead in some embodiments to a degeneration of the optical properties, so desirable results can be achieved through a shift in equilibrium in a reasonably controlled way, generally for a short period of time, to generate sufficient fusing to obtain desired electrical conductivity while maintaining desired optical properties. In general, the fusing process can be performed with controlled exposure to a fusing vapor and/or through the use of a fusing agent in solution. Under appropriate conditions, the fused metal conductive network is a unitary structure.

In some embodiments, initiation of the fusing process can be controlled through a partial drying of the solutions to increase concentrations of the components, and quenching of the fusing process can be accomplished, for example, through rinsing or more completing drying of the metal layer. In some embodiments, subsequent processing with the deposition of another ink provides for the fusing of the metal nanowires into a fused metal nanostructured network, which is electrically conducting. The fusing agent can be incorporated into a single ink along with the metal nanowires. A one ink formulation for forming a unitary fused metal conductive network with the thin, uniform metal nanowires is described in the Examples below.

The metal nanowire layers can be dried, for example, with a heat gun, an oven, a thermal lamp or the like, although the films that can be air dried can be desired in some embodiments. In some embodiments, the films can be heated to temperatures from about 50° C. to about 150° C. during drying. The drying conditions can be designed to control the fusing process, although the ink design can provide appropriate use of readily available process conditions in conventional process equipment. After drying, the films can be washed one or more times, for example, with an alcohol or other solvent or solvent blend, such as ethanol or isopropyl alcohol, to remove excess solids to lower haze.

One or more overcoat layers can be applied over the sparse metal conductive layer, as described above. The overcoat processing is similar to the undercoat processing described above with suitable replacement of the coating solution. Patterning and other further processing after application of the overcoat is described further below.

After application of the overcoat and drying/curing of the overcoat on the first processed side, the overcoat can be covered by a release layer. The second side can have the release layer removed to expose the second surface of the substrate for processing of the transparent conductive layer. The removal of the release layer from the second surface and placement of a release layer on the first surface can be performed sequentially or approximately simultaneously. The sequential removal and placement of release layers can generally be performed in either order, although the placement of the release layer first over the processed first layer can be desirable due to the avoidance of having an unsupported substrate moving for significant distances through a conveyor system. Also, the sequential placement of the release layer over the first processed side of the substrate would be consistent with then flipping the structure to have the release layer removed from the second surface while the second surface is facing upward, which maintains all processing associated with an upward facing surface. The simultaneous or approximately simultaneous performance of these tasks can be interpreted through the eyes of a person of ordinary skill in the art as having the components accompanying these tasks sufficiently close that their designs impact each other.

Once the second surface is exposed through the removal of the release layer, then the second surface can be similarly processed as the first surface. Specifically, if a hardcoat (undercoat) is desired and not supplied with the substrate, then a hardcoat can be applied as described above. The deposition and processing of the sparse metal conductive layer, generally a fused metal nanostructured network, can be deposited as described above. After the sparse metal conductive layer is applied and dried and/or cured, then an overcoat layer can be applied and dried/cured as described above. After completing the processing of the transparent conductive layer on the second side of the substrate, a release layer can be used to cover this surface.

In some embodiments, the processing is efficiently performed on a roll-to-roll format, in which a roll of substrate is patterned, and the processed structure is rolled up for further processing. Such roll-to-roll processing would be adaptable to commercial coating equipment and conveyors. For processing a second side, the rolled up product of the first side coating can be turned to unroll the rolled up structure to have the other surface facing the coating head.

Figure 4:
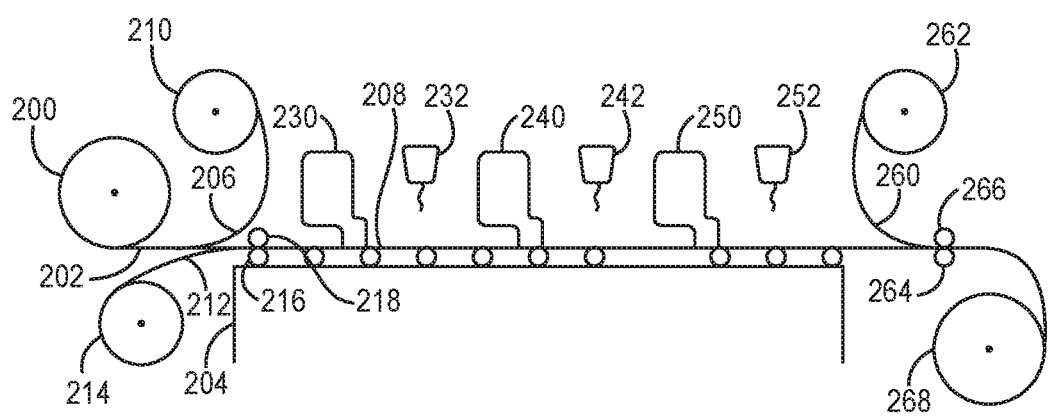
FIG. 4 is a schematic depiction of the roll to roll processing of the double coated structures described herein.

A schematic diagram of roll-to-roll processing of one surface of the substrate is shown in FIG. 4. Substrate supply roll 200 provides substrate sheet 202 that is carried through conveyor system 204. If substrate supply roll 200 provides the substrate with an initial release layer 206 over first surface 208 in which initial release layer 206 is to be removed prior to further processing, initial release layer 206 can be separated from substrate sheet 202 and placed into an initial release layer take up roll 210. If a process release layer 212 is to be placed over the second surface of substrate sheet 202 to support the substrate during processing, process release layer 212 can be dispersed from process release layer roll 214. Lamination rollers 216, 218 can be used to laminate process release layer 212 with substrate sheet 202, which may or may not involve heat along with reasonable pressures. If the substrate is provided on substrate supply roll 200 without an initial release layer, then the process of delaminating and rolling up the initial release layer would be absent. Also, if the substrate is provided on substrate supply roll 200 already with a process release layer, the structure providing the process release layer from a roll and lamination of the process release layer with the substrate would not be needed.

With substrate sheet 202 prepared with process release layer 212, coatings can be applied to the first surface 208 of substrate sheet 202. If a hardcoat underlayer is to be applied, the hardcoat precursor solution can be applied with first coater 230, such as a slot coater that applies a selected thin coating from a reservoir. With the hardcoat precursor solution applied, substrate sheet 202 can proceed to first coating processor station 232. First coating process station 232 can comprise a drying tool and/or a radiation source. A drying tool can be supply heat to remove solvent and or crosslink polymers, and suitable drying tools include, for example, ovens, hot air blowers, heat lamps, and the like. Suitable radiation sources include, for example, UV lamps, electron beams, or other suitable radiation sources. Heat lamps can in principle supply desired heat and radiation, such as infrared radiation. For a UV curable hardcoat, the radiation source can be a UV light source.

Whether or not a hardcoat undercoat is applied, a nanowire ink is coated onto substrate sheet 202 with second coater 240 for the formation of a sparse metal conductive layer. After applying a nanowire ink, substrate sheet 202 proceeds to second coating processor station 242. Second coating processor station 242 can comprise a drying tool and/or a radiation source. Suitable drying tools and radiation sources are described for first coating processing station 232 above and apply equally for second coating processor station 242 as if written here. If the nanowire ink comprises a fusing solution, the resulting sparse metal conductive layer can comprise a fused metal nanostructured network.

After the sparse metal conductive layer is formed, substrate sheet 202 proceeds through conveyor system 204 to apply an overcoat layer. Specifically, third coater 250 is used to apply an overcoat precursor solution over the sparse metal conductive layer. Conveyor system 204 then conveys substrate sheet 202 with the overcoat precursor solution to third coating processor station 252. Third coating processor station 252 can comprise a drying tool and/or a radiation source. Suitable drying tools and radiation sources are described for first coating processing station 232 above and apply equally for third coating processor station 252 as if written here. In an actual commercial roll-to-roll processor, first coating processor station 232 (if present), second coating processor station 242, and third coating processor station 252 may or may not be the same as each other, with respect to any pair from the three, even if the range of possible designs are essentially the same for the three processing stations.

After the overcoat is completed, if no additional processing of the first surface 208 is desired before processing of a second surface on the other side of substrate sheet 202, a second process release layer 260 can be delivered from supply roll 262 and placed over the overcoat on substrate sheet 202. Substrate 202 and second process release layer 260 can be laminated with rollers 264, 266. With second process release layer 260 in place substrate sheet 202 can be placed on storage roller 268. If desired, first process release layer 212 can be removed prior to placing processes substrate sheet 202 on storage roller 268, but this release of first process release layer can be performed at the start of the processing of the second surface. In another alternative embodiment, substrate sheet 202 can be placed on storage roller 268 without placement of second process release layer, such that supply roll 262 and rollers 264, 266 would not be needed. Then, second process release layer 260 can be placed on substrate sheet 202 at the start of processing the second surface.

While in principle, the second layer can be processed without placement of the substrate sheet 202 on storage roller 268, there are practical hurdles, although this remains an option. Generally, it is not desirable to apply the coatings on a lower surface due to gravity. To flip the moving substrate sheet would generally need a significant amount of space or the lateral stacking of the process equipment. While these are not insurmountable obstacles, it is generally significantly more convenient to place substrate sheet 202 on storage roller 268 and move the roll to position to process the second side. For example, storage roll 268 can be flipped over and put in place of supply roll 200 with the substrate sheet then coming from the top of the roll rather than the bottom. Appropriate processing can be done to expose the second surface for processing with the support of second process release layer 260, which can be put in place at the end of processing the first surface or at the start of processing the second surface. Then, the second surface of substrate sheet 202 can be processed analogously to the first surface using the same or equivalent process components. At the end of processing the second surface of substrate layer 202, the second surface may or may not be covered with a release layer and the substrate sheet may or may not be placed on a storage roll prior. In any case, the double coated substrate sheet can then be ready for further processing into a device at the same location or at a remote location following shipping.

Touch Sensors and Corresponding Processing

While the double sided transparent, conductive structure can be used for various applications, the structures can be particularly useful for forming touch sensors. The patterning can be performed for each side of the structure to form conductive patterns desirable for a touch sensor or the like. In general, patterning can be performed with various patterning techniques in the art. One commercial patterning approach useful for touch sensors is based on UV laser ablation. The UV laser light would have a wavelength that is absorbed by the substrate, and suitable UV lasers generally operate from 190 nm to 355 nm. Alternatively, photolithography can be used for patterning, in which a light sensitive composition, i.e., a photoresist, is patterned with patterned illumination, such as through a mask, or with a direct write lithography equipment. The latent image in the photoresist is developed to form a physical pattern that is then transferred to the conductive layer.

Once a conductive layer is patterned, additional layers can be placed over the patterned conductive layer for incorporation of the structure into a device. Flexible optically conductive adhesives can be used to secure the patterned two sided conductive structure to other structures along both surfaces. Suitable adhesive tapes are available commercially, for example, from Lintec Corporation (MO series); Saint Gobain Performance Plastics (DF713 series); Nitto Americas (Nitto Denko) (LUCIACS CS9621T and LUCIAS CS9622T); LG Hausys OCA (OC9102D, OC9052D); DIC Corporation (DAITAC LT series OCA, DAITAC WS series OCA and DAITAC ZB series); PANAC Plastic Film Company (PANACLEAN series); Tesa SE (Germany) (AF61, 694 series, 696 series, and 697 series); Minnesota Mining and Manufacturing (3M, Minnesota U.S.A.—product numbers 8146, 8171, 8172, 8173, 1414-1, 9894, and similar products) and Adhesive Research (for example product 8932). Generally, metal traces can be connected to the transparent conductive layer along the edges of the pattern to provide for ultimate connection to an electrical circuit.

With respect to the corresponding properties of the multilayered films, the additional components are generally selected to have a small effect on the optical properties, and various coatings and substrates are commercially available for use in transparent elements. Suitable optical coatings, substrates and associated materials are summarized above. Some of the structural material can be electrically insulating, and if thicker insulating layers are used, the film can be patterned to provide access and electrical contact to the otherwise embedded electrically conductive element.

Figure 3:
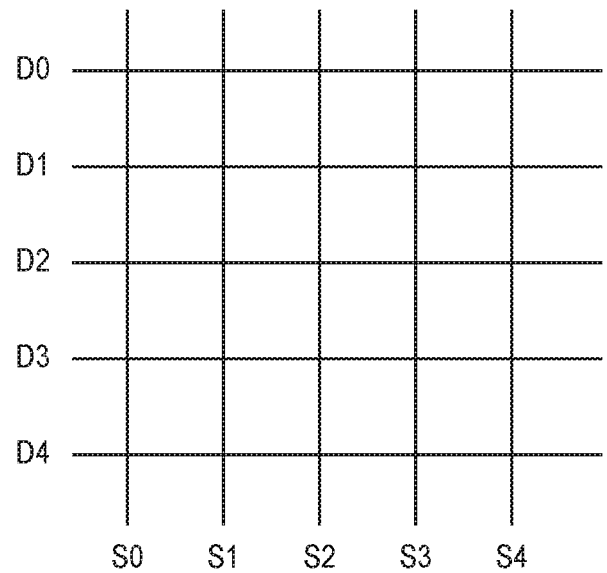
FIG. 3 is a schematic top view of the pattern of a touch sensor formed with a structure with two stacked patterned transparent conductive layers forming component electrodes of the touch sensor.

For the production of sensors or the like, patterning is generally performed as outlined above to generate electrically conductive regions and electrically insulating regions, which are both transparent. A schematic view of the layout of a portion of a tough sensor viewed from above is shown in FIG. 3. Conductive lines D0-D4 would be along one transparent conductive surface, and conductive lines S0-S4 would be on the other transparent conductive surface of the structure. In some embodiments, an electrical signal can be directed along a conductive line Dn for sensing along conductive lines Sm if a touch is located near the intersection of lines Dn and Sm. The capacitive response of the conductive lines is altered by the touch.

Transparent Electrically Conductive Film Stability and Stability Testing

In use, it is desirable for the transparent conductive films to last a commercially acceptable time, such as the lifetime of the corresponding device. The stabilization compositions and structures described herein have this objective in view, and the properties of the sparse metal conductive layers are sufficiently maintained. To test the performance, accelerated aging procedures can be used to provide objective evaluation over a reasonable period of time. These tests can be performed using commercially available environmental test equipment.

A selected test, which is used in the Examples (Xenon test) involves black standard temperature of 60° C. (a setting of the apparatus), an air temperature of 38° C., a relative humidity of 50% and an irradiance of 60 W/m$^2$ (300 nm to 400 nm) from xenon lamps with a daylight filter. A variety of suitable test equipment is commercially available, such as Atlas Suntest™ XXL apparatus (Atlas Material Testing Solutions, Chicago, IL, USA) and a SUGA environmental test instrument, Super Xenon Weather Meter, SX75 (SUGA Test Instruments Co., Limited, Japan). In a second accelerated wear test, the chamber temperature is set at 85° C. and the relative humidity is set at 85% with no illumination. For this high temperature high humidity test, suitable equipment is commercially available such as an ESPEC Model BTL-433 Environmental Chamber (ESPEC Corp. North America, Inc. Hudsonville, MI, USA), and a Thermotron SM-3.5-3800 Benchtop Environmental Chamber (Thermotron Inc., Holland, MI, USA). The Examples below provide testing with two different stack structures incorporating fused metal nanostructures networks, and the specific stack structures are described below.

Under the test conditions specified in the previous paragraph, a sample can be evaluated by the change in sheet resistance as a function of time. The values can be normalized to the initial sheet resistance to focus on the time evolution. So generally the time evolution is plotted for $R_t/R_0$, where $R_t$ is the time evolving sheet resistance measurement and $R_0$ is the initial value of sheet resistance. In some embodiments, the value of $R_t/R_0$ can be no more than a value of 1.8 after 1000 hour, in further embodiments no more than a value of 1.6, in additional embodiment no more than a value of 1.4, and in other embodiments no more than a value of 1.2 after 500 hours of environmental testing. From another perspective, the value of $R_t/R_0$ can be no more than a value of 1.5 after about 1000 hours, in further embodiments no more than a value of 1.5 after about 1500 hours and in additional embodiments no more than a value of 1.5 after about 2000 hours of environmental testing. In additional embodiments, the value of $R_t/R_0$ can be no more than a value of 1.2 after about 750 hours. A person of ordinary skill in the art will recognize that additional ranges of $R_t/R_0$ and stability times within the explicit ranges above are contemplated and are within the present disclosure.

EXAMPLES

The optical properties of the transparent conductive films were examined for silver nanowires formed into films within the dual coated structures described herein. Activegrid™ Ink from C3Nano Inc. was used to form the films. The processing details and the structures are described further below.

Measurements were performed on specific structures shown below. For the conductive structures, the transparent conductive film was formed using a silver nanowire ink essentially as described in Example 5 of the '968 patent, cited above. The Activegrid™ product had silver nanowires with an average diameter of about ~20-25 nm. The drying process in the roll-to-roll processing described below induced chemical fusing as the solvent was removed concentrating the constituents, in which further reaction was ended by the continued drying. The amount of silver deposited is selected to target a film with roughly either 50 ohms/sq or 70 ohms/sq sheet resistance, as noted in the specific samples below. After drying the conductive film, a commercial overcoat was slot coated in the roll-to-roll processing over the dried transparent conductive film. The overcoat is dried and crosslinked with a UV lamp to form an overcoat with a thickness of about 50-100 nm.

Optical and Electrical Property Testing

The sheet resistance, total transmission (TT), haze, and b* values for a series of examples were obtained. Sheet resistance ($\Omega/\square$) was measured with 4-point probe method, a contactless resistance meter, or by measuring the resistance of the film by using a square defined by two solid (non-transparent) lines of silver formed from silver paste. In some embodiments, a pair of parallel stripes of silver paste was applied onto a surface of the samples to define a square, or a rectangular shape, which were then annealed at roughly 120° C. for 20 minutes to cure and dry the silver paste. Alligator clips were connected to the silver paste stripes and the leads were connected to a commercial resistance measurement device.

The total transmission (TT) and haze of the film samples were measured using a haze meter. The instrument is designed to evaluate optical properties based on ASTM D 1003 standard ("Standard Test Method for Haze and Luminous Transmittance of Transparent Plastics"), which is incorporated herein by reference. The total transmission and (transmission) haze of these films include the substrate. The polyimide substrates used in Examples 1-4 and 6 has a total transmission of 91.5%, a haze in the range of 0.12% to 0.17%, and b* in the range from 0.74 to 0.80. The substrates for Example 5 had similar optical properties. CIELAB values for b* were determined using commercial software from measurements made with a Konica Minolta Spectrophotometer CM-3700A with SpectraMagic™ NX software.

Reliability Testing

Because it is desirable for transparent conductive films to last a commercially acceptable time, such as the lifetime of the corresponding device, various accelerated aging tests were used to provide objective evaluation over a reasonable period of time. The specific tests were 65° C./90% RH (relative humidity), 85° C./85% RH, and Xenon light tests, described in further detail below. These tests were performed using commercially-available environmental test equipment noted below.

Two tests were performed without illumination at 85° C. and a relative humidity of 85% or at 65° C./90% RH. These tests are referred to as the 85 C/85% RH test or the 65 C/90% RH test, respectively.

Another test involves black standard temperature of 60° C. (a setting of the apparatus), an air temperature of 38° C., a relative humidity of 50% and an irradiance of 60 W/m$^2$ (300 nm to 400 nm) from xenon lamps with a daylight filter. This test is referred to as the xenon light test. A variety of suitable test equipment is commercially available, such as Atlas Suntest™ XXL apparatus (Atlas Material Testing Solutions, Chicago, IL, USA) and a SUGA environmental test instrument, Super Xenon Weather Meter, SX75 (SUGA Test Instruments Co., Limited, Japan). Under the test conditions specified in these tests, a sample can be evaluated by the change in sheet resistance as a function of time. The values can be normalized to the initial sheet resistance to focus on the time evolution. Generally, the time evolution is plotted as $R/R_0$ or $R_t/R_0$, where $R_t$ is the time evolving sheet resistance measurement and $R_0$ is the initial value of sheet resistance.

Preparation of Test Samples

Figure 5:
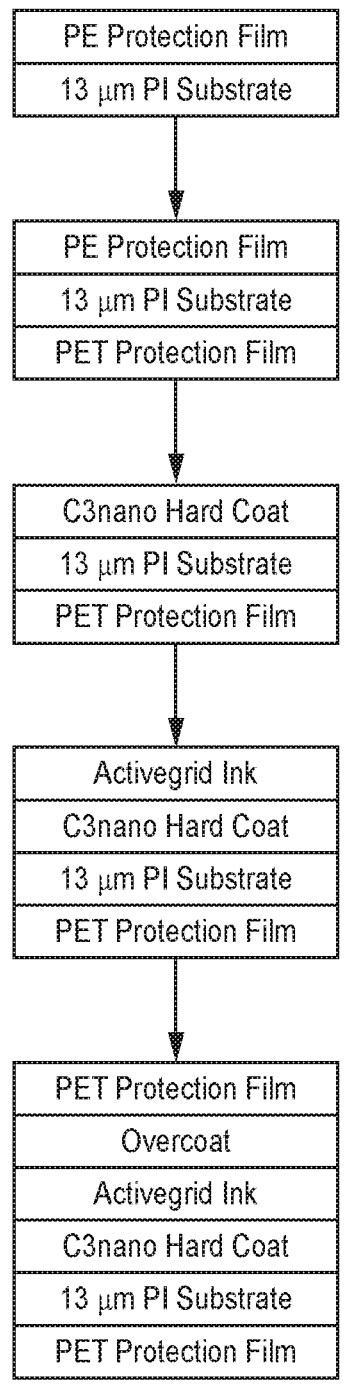
FIG. 5 is a flow diagram indicating the roll-to-roll processing used to coat the first side of the substrate used in the Examples.

In the following examples, the structures were prepared according to the processing shown in FIGS. 5 and 6, which depict the processing to form the test samples which are subjected to testing in the following Examples. Referring to FIG. 5, the coating of the first side of the substrate is schematically shown. The substrate was supplied with a polyethylene (PE) protection film. Prior to placement in the coater, a PET film is laminated to the exposed side of a polyimide substrate, as depicted in the first step in FIG. 5. Two different polyimide (PI) substrates are studied in the following examples. As shown in the second step of FIG. 5, the PE protection film is removed by peeling away the PE film to expose the first surface for processing, and an acrylate based commercial hardcoat is applied to the substrate using slot coating, air drying and a UV cure. After exposing the substrate surface for coating, the structure is placed in a coating apparatus. As shown in the next step of FIG. 5, a conductive ink comprising a solvent with a stable dispersion of silver nanowires (AgNWs), a polymer binder, and a fusing solution is applied to the cured hardcoat using slot coating. The nanowire coating is air dried (with heated forced air) to form a fused metal nanostructured network. An acrylate overcoat solution is applied over the transparent conductive film using slot coating, the then air dried and subjected to a UV cure. After curing the overcoat, a PET protection film is laminated to the overcoat to form a release layer, as shown in the last step of FIG. 5.

Figure 6:
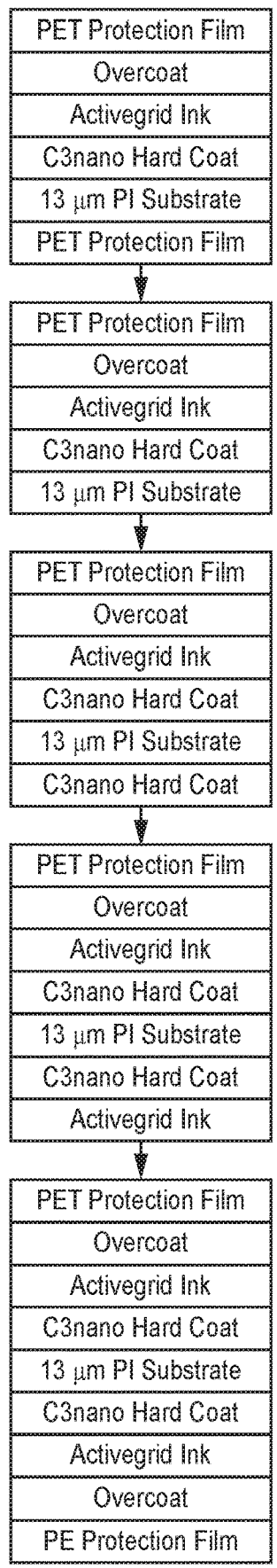
FIG. 6 is a flow diagram indicating the roll-to-roll processing used to coat the second side of the substrate used in the Examples.

Referring to FIG. 6, the processing of the second side of the substrate is depicted. The product of the first side of the substrate shown in FIG. 5 is taken up on a roll. To process the second side, the roll is turned over and processed through the same equipment used for coating the first side. In the first step of FIG. 6, the PET protection film covering the second surface of the substrate is peeled away to expose the second surface of the substrate. As shown in the second step of FIG. 6, an acrylate based hardcoat is applied to the exposed surface of the polyimide substrate using slot coating, and then the hardcoat is air dried, and subjected to UV curing. A conductive ink comprising a solvent with a stable dispersion of silver nanowires (AgNWs), a polymer binder, and a fusing solution is applied to the cured hardcoat, and then air drying is applied to form a fused metal nanostructured network, as is shown schematically following the third step in FIG. 6. An overcoat precursor solution is then applied over the transparent conductive film, which is then air dried and subjected to a UV cure. As depicted in the final step of FIG. 6, a PE protection film is laminated over the cured overcoat.

Examples 1 and 2

These examples provide reliability test results under high temperature and relative humidity test conditions or under Xe illumination conditions for samples with hardcoat undercoat between the substrate and the fused metal nanostructured network for two different optically clear adhesives.

In Examples 1 and 2, samples were prepared as described above using a 13 micron polyimide substrate from Taimide, which is clear in the visible spectrum and blocking of UV light.

The optical and electrical properties of the films were measured, twice, and are summarized in Table 1 below.

TABLE 1

| Resistance - PET side | 52 Ω/□ |
|---|---|
| Resistance - PE side | 48 Ω/□ |
| Transmittance | 91.1% |
| Haze | 1.19% |
| b* | 3.12 |

Figures 7, 8:
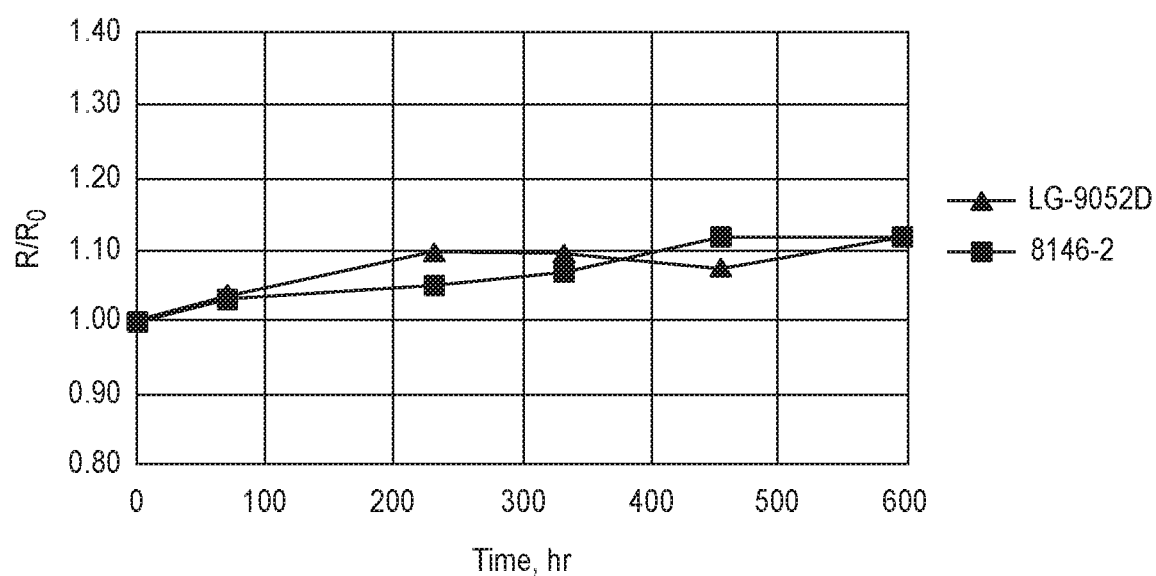
FIG. 7 is a schematic section diagram showing a structure with two conductive surfaces and a hardcoat undercoat used for testing samples under an 85 C/85% RH testing conditions.
FIG. 8 is a plot of R/Ro as a function of time for a double sided conductive structure of FIG. 7 using a first PI substrate subjected to a 85 C/85% RH accelerated wear testing.

The samples were also subjected to stability testing under two different testing conditions, using both a high temperature/high humidity test (85° C./85% RH) and a Xe illumination test. The 85° C./85% RH test was performed with the structure depicted in FIG. 7. Referring to FIG. 7, a 125 μm HC-PET film is applied to both sides of the structure using two different commercial optically clear adhesives: Example 1—LG 9052D and Example 2—3M 8146-2. Examples 1 and 2 include hardcoats between the polyimide substrate and the fused metal nanostructured network, on both sides of polyimide substrate. Using 85° C./85% RH test conditions in a controlled test apparatus, the resistance (R/Ro) was measured as a function of time over six hundred (600) hours, and the time dependence of the resistance is depicted in FIG. 8.

Figure 9:
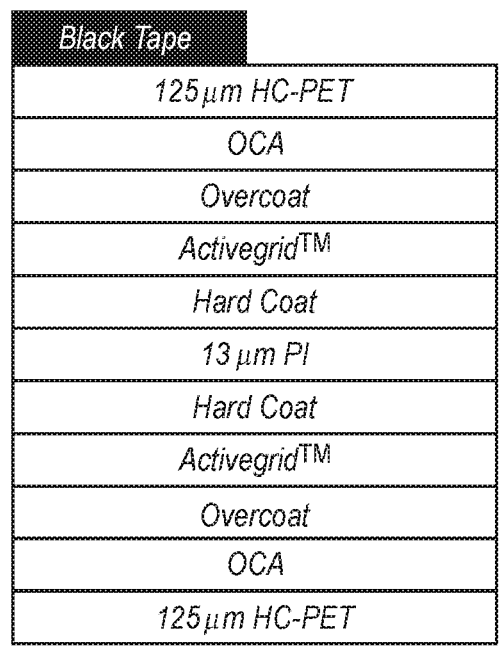
FIG. 9 is a schematic sectional diagram of a structure used for performing a Xe illumination test of conductive structure.
Figure 10:
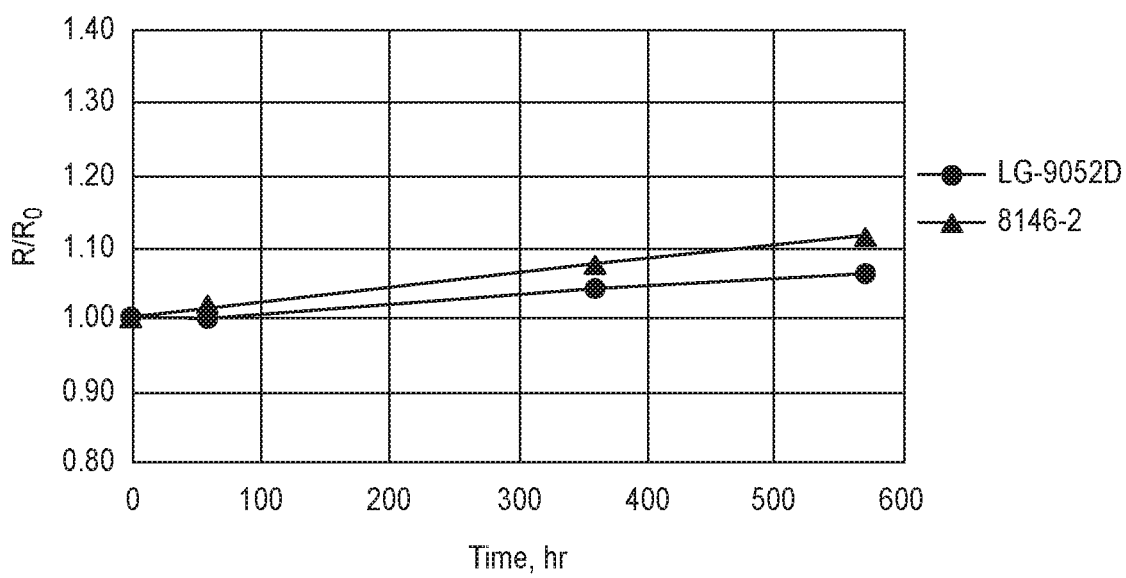
FIG. 10 is a plot of R/Ro as a function of time for a double sided conductive structure as shown in FIG. 9 under Xe test conditions using the first PI substrate.

In another set of test, the samples were subjected to Xe Light test conditions. Xe Light test testing was performed using the structure of FIG. 9, which is the structure of FIG. 7 with half of the surface covered with black tape in an Atlas Suntest™ XXL apparatus. The conditions in the testing apparatus had a black standard temperature of 60° C. (a setting of the apparatus), an air temperature of 38° C., a relative humidity of 50%, and an irradiance of 60 W/m² (300 nm to 400 nm) from xenon lamps with a daylight filter. Referring to FIG. 9, the hard coated-PET back cover sheet was placed facing upward toward the light in the apparatus and about half of the area was covered with black tape, unless indicated otherwise. For the Xe light tests, R/Ro was measured at over five hundred (500) hours and is depicted in FIG. 10.

For Examples 1 and 2, all of the samples passed the testing under the conditions of the test, which was determined as having a value of R/Ro at the end of the test time of <1.1.

Examples 3 and 4

These examples test the reliability under test conditions for samples prepared without the hardcoat undercoat.

Figure 11:
FIG. 11 is a schematic section diagram showing a structure with two conductive surfaces without a hardcoat undercoat used for testing samples under an 85 C/85% RH testing conditions.
Figure 12:
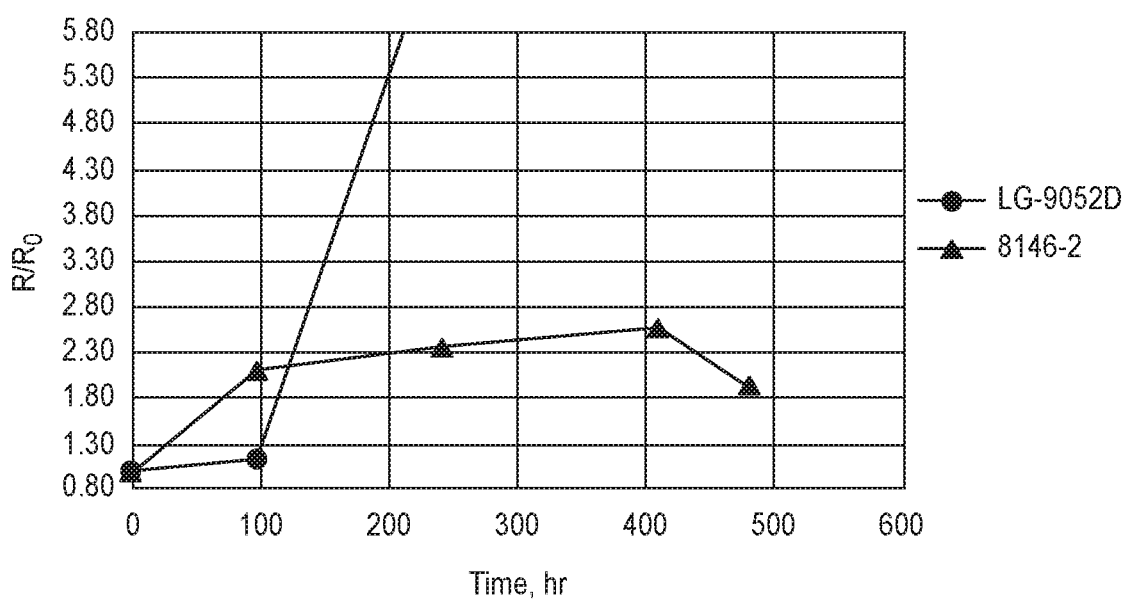
FIG. 12 is a plot of R/Ro as a function of time for a double sided conductive structure of FIG. 11 using the first PI substrate subjected to a 85 C/85% RH accelerated wear testing.

The coated substrate is prepared as described above for Examples 1 and 2 except that the placement of the hardcoat is omitted, and then the test structure is assembled. Referring to FIG. 11, the test samples for Examples 3 and 4 were similar in structure to samples in Examples 1 and 2 (FIG. 7), except that no hardcoat is present. The transparent conductive film is applied to both sides of the polyimide substrate and the overcoat is applied over the transparent conductive films on each side. A PET protection film is applied over the overcoats on each side using two different optically clear adhesives: Example 3—LG 9052D and Example 4—3M 8146-2. The resistance (R/Ro) using 85° C./85% RH test conditions was measured over six hundred (600) hours and is depicted in FIG. 12.

Figure 13:
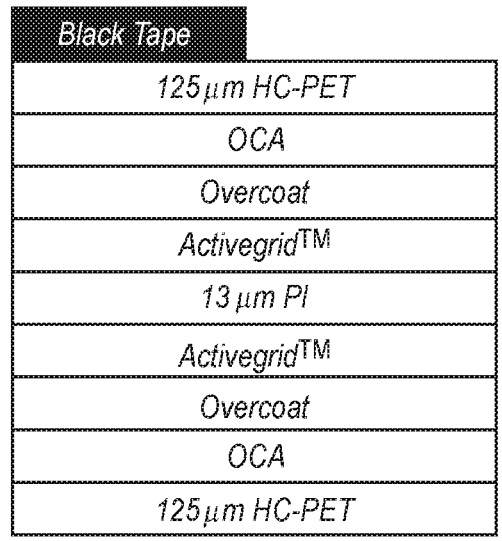
FIG. 13 is a schematic sectional diagram of a structure used for performing a Xe illumination test of a conductive structure.
Figure 14:
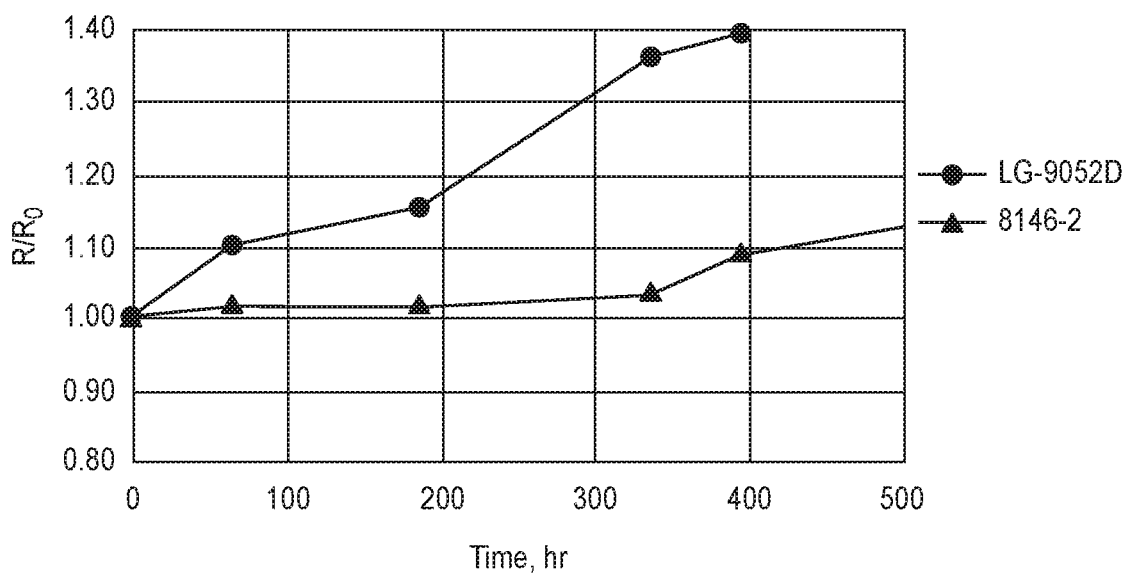
FIG. 14 is a plot of R/Ro as a function of time for a double sided conductive structure under a Xe test conditions as shown in FIG. 13 using the first PI substrate.

For a Xenon light test, a structure was formed as shown in FIG. 13. The resistance (R/Ro) using Xe Light test conditions was measured at over five hundred (500) hours, and the results are depicted in FIG. 14 with the resistance plotted as a function of test time. Accelerated testing was performed in an Atlas Suntest™ XXL apparatus (Atlas Material Testing Solutions, Chicago, IL, USA). The conditions in the testing apparatus had a black standard temperature of 60° C. (a setting of the apparatus), an air temperature of 38° C., a relative humidity of 50%, and an irradiance of 60 W/m² (300 nm to 400 nm) from xenon lamps with a daylight filter. The hard coated-PET back cover sheet was placed facing upward toward the light in the apparatus and about half of the area was covered with black tape, unless indicated otherwise.

For these samples, the R/Ro values under the 85 C/85% RH test conditions failed to maintain values under 1.2 by the end of the test. Under the Xe test conditions, only the sample with the OCA-B met the objective of maintaining values under 1.2 for R/Ro. These examples demonstrate the usefulness of the hardcoat under coating for these substrates.

Example 5

This example tests the reliability for double sided conductive structures with a thin polyimide substrate from an alternative supplier without the use of a hardcoat under coating below the transparent conductor.

Samples were prepared with roll-to-roll processing as described above for a double sided conductive structure as described above with a 15 micron thick transparent polyimide sheet from Kolon. Referring to FIGS. 15 and 16, the transparent conductive film was applied to the Kolon CPI, and an overcoat is applied over the transparent conductive film and a PET protection film is applied over the overcoat using optically clear adhesives (Flexible OCA from 3M). For the Xe test, black tape was applied over a half of the top surface, as shown in FIG. 16.

Figure 17:
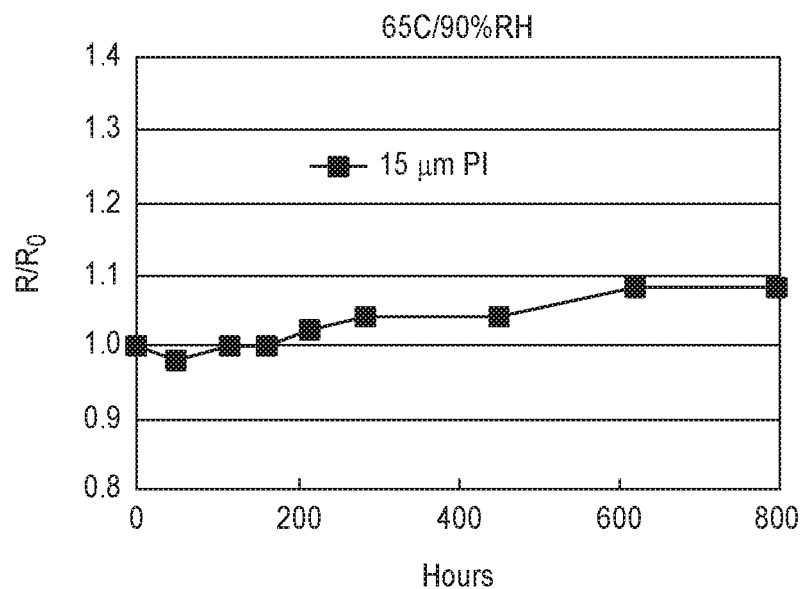
FIG. 17 is a plot of R/Ro as a function of time for a double sided conductive structure of FIG. 15 using a second PI substrate subjected to a 65 C/90% RH accelerated wear testing.
Figure 18:
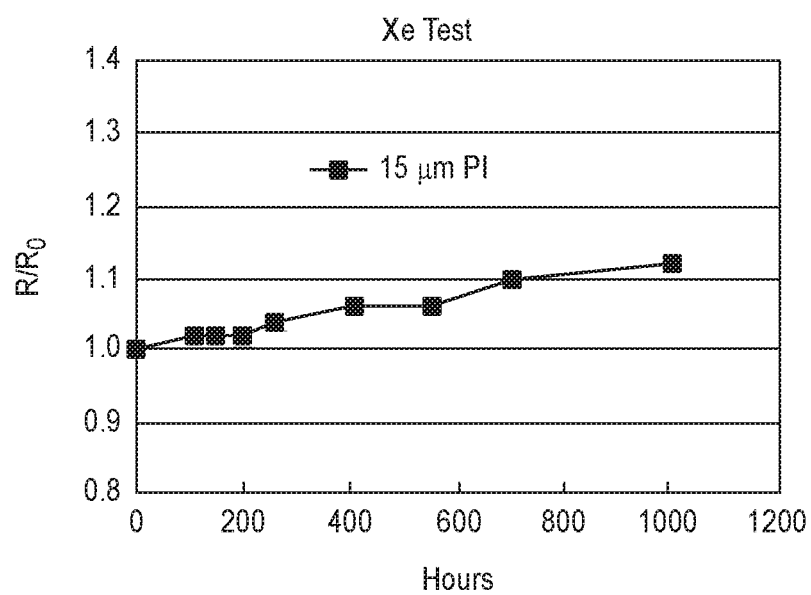
FIG. 18 is a plot of R/Ro as a function of time for a double sided conductive structure under a Xe test conditions as shown in FIG. 16 using the second PI substrate.

The resistance (R/Ro) using 65° C./90% RH test conditions was measured over eight hundred (800) hours, and a plot of the time dependence is depicted in FIG. 17. The resistance (R/Ro) using Xe Light test conditions was measured at over a thousand (1000) hours and is depicted in FIG. 18. Accelerated testing was performed in an Atlas Suntest™ XXL apparatus (Atlas Material Testing Solutions, Chicago, IL, USA). The conditions in the testing apparatus had a black standard temperature of 60° C. (a setting of the apparatus), an air temperature of 38° C., a relative humidity of 50%, and an irradiance of 60 W/m² (300 nm to 400 nm) from xenon lamps with a daylight filter. The hard coated-PET back cover sheet was placed facing upward toward the light in the apparatus and about half of the area was covered with black tape, unless indicated otherwise. A summary of the 65 C/90% RH, 85 C/85% RH tests is included in Table 2. For these samples, good test results were obtained without a hardcoat in the structure.

TABLE 2

| Sample | Test Condition | Sheet Resistance ($\Omega/\square$) (each side) | Duration, hours | |
|---|---|---|---|---|
| 15 µm Kolon CPI | 65° C./90% RH | 50 (double-sided) | 800 | $R/R_0 \leq 1.10$ |
| 15 µm Kolon CPI | Xe Light test | 50 (double-sided) | 1000 | $R/R_0 \approx 1.11$ |

Example 6

This example reproduces the testing from Example 5 with the substrate of Examples 1-4.

Samples were prepared with roll-to-roll processing as described above for a double sided conductive structure as shown in FIGS. 7 and 9 with a 13 micron thick transparent polyimide sheet from Taimide. The structures had a flexible optically clear adhesive from 3M Corporation.

Figure 19:
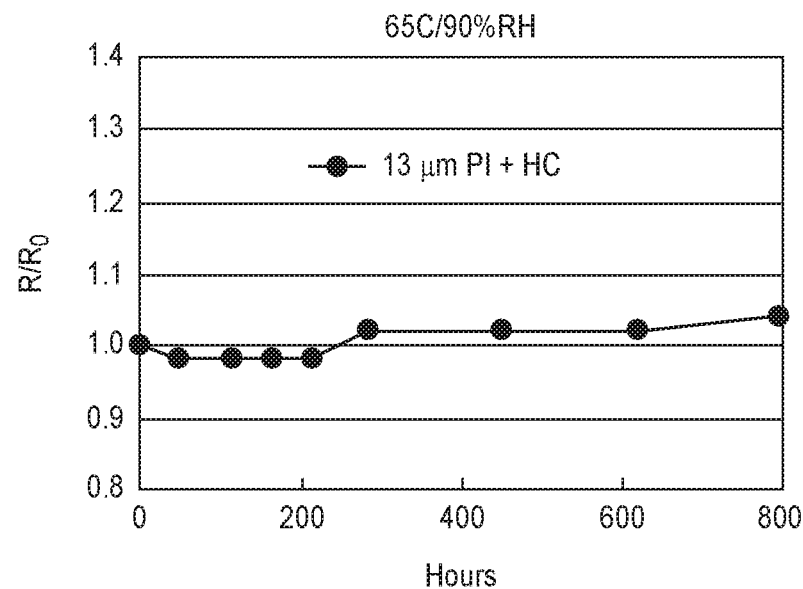
FIG. 19 is a plot of R/Ro as a function of time for a double sided conductive structure of FIG. 7 using a first PI substrate subjected to a 65 C/90% RH accelerated wear testing.
Figure 20:
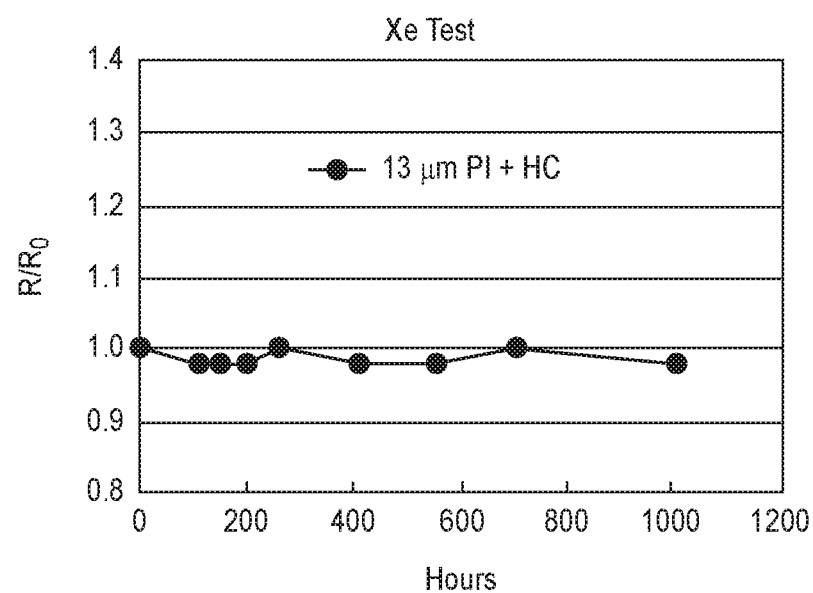
FIG. 20 is a plot of R/Ro as a function of time for a double sided conductive structure under a Xe test conditions as shown in FIG. 9 using the first PI substrate.

The resistance (R/R₀) using 65° C./90% RH test conditions was measured over eight hundred (800) hours, and a plot of the time dependence is depicted in FIG. 19. The resistance (R/R₀) using Xe Light test conditions was measured at over a thousand (1000) hours and is depicted in FIG. 20. The testing was performed as described in Example 5. The stability results were outstanding.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:
1. A double sided conductive structure comprising:
   a transparent polymer substrate comprising a polymer and having a first surface and a second surface, wherein the polymer substrate has an average thickness of no more than about 27 microns and the polymer in a configuration of the transparent polymer substrate has a transmittance from 400 nm to 750 nm of at least about 88% and over the UV spectrum from 330 nm to 375 nm of no more than about 15%;
   a first sparse metal conductive layer supported on the first surface of the transparent polymer substrate;
   a second sparse metal conductive layer supported on the second surface of the transparent polymer substrate; and
   first and second polymer overcoats over the first and second sparse metal conductive layers, respectively, wherein each of the first and second polymer overcoats has an average thickness from about 10 nm to about 200 nm;

wherein each surface of the double sided conductive structure has a sheet resistance of no more than about 120 Ohms/sq.

2. The double sided conductive structure of claim 1 further comprising a first hardcoat layer and a second hardcoat layer, each having an average thickness of from about 50 nm to about 3 microns, wherein the first hardcoat layer is between the first surface of the transparent polymer substrate and the first sparse metal conductive layer, wherein the second hardcoat layer is between the second surface of the transparent polymer substrate and the second sparse metal conductive layer, and wherein both hardcoat layers comprise a crosslinked polyacrylate polymer.

3. The double sided conductive structure of claim 2 wherein each hardcoat layer has a thickness from about 100 nm to about 2.5 microns and comprises a highly crosslinked polyacrylate.

4. The double sided conductive structure of claim 1 wherein the double sided conductive structure can be assembled into a test structure with an optically clear adhesive and a 125 micron thick PET film over each surface and subjected to accelerated wear testing at 85° C. and 85% relative humidity for 500 hours with an increase in sheet resistance of no more than about 20%.

5. The double sided conductive structure of claim 1 wherein the transparent polymer substrate comprises polyimide.

6. The double sided conductive structure of claim 1 wherein the polymer substrate has an elongation of at least about 10%, a tensile strength of at least about 50 MPa, and a Young's modulus from about 1.5 GPa to about 7.0 GPa.

7. The double sided conductive structure of claim 1 wherein the transparent polymer substrate comprises polysulfide, polysulfone, polyethylene naphthalate or polyethersulfone.

8. The double sided conductive structure of claim 1 wherein each of the first and second sparse metal conductive layers comprises a fused metal nanostructured network and wherein the double sided conductive structure can be bent around a 1 mm diameter mandrel repeatedly for at least 200,000 times with the sheet resistance of the conductive surfaces changing by no more than 10%.

9. The double sided conductive structure of claim 8 wherein each surface of the double sided conductive structure has a sheet resistance of no more than about 100 Ohms/sq.

10. The double sided conductive structure of claim 9 having a transmittance of visible light of at least about 88%, a haze of no more than about 2.5% and a value of b* of no more than about 4.0.

11. The double sided conductive structure of claim 1 having an average thickness of no more than about 30 microns,
a % TT of at least 89%, a haze of no more than 2.5%, and a b* of no more than about 3.5, and each surface of the double sided conductive structure has a sheet resistance of no more than 100 Ohms/sq,
wherein the double sided conductive structure can be assembled into a test structure with an optically clear adhesive (3M, 8146) and a 125 micron thick PET film over each surface and subjected to accelerated wear testing at 85° C. and 85% relative humidity for 500 hours with an increase in sheet resistance of no more than about 40%.

12. The double sided conductive structure of claim 11 further comprising a first hardcoat layer and a second hardcoat layer, each having an average thickness of from about 50 nm to about 3 microns, wherein the first hardcoat layer is between the first surface of the transparent polymer substrate and the first sparse metal conductive layer, wherein the second hardcoat layer is between the second surface of the transparent polymer substrate and the second sparse metal conductive layer, and wherein both hardcoat layers comprise a crosslinked polyacrylate polymer.

13. The double sided conductive structure of claim 12 wherein each hardcoat layer has a thickness from about 100 nm to about 2.5 microns and comprises a highly crosslinked polyacrylate.

14. The double sided conductive structure of claim 11 wherein the double sided conductive structure can be assembled into a test structure with an optically clear adhesive and a 125 micron thick PET film over each surface and subjected to accelerated wear testing at 85° C. and 85% relative humidity for 500 hours with an increase in sheet resistance of no more than about 20%.

15. The double sided conductive structure of claim 11 wherein the transparent polymer substrate comprises polyimide.

16. The double sided conductive structure of claim 11 wherein the polymer substrate has an elongation of at least about 10%, a tensile strength of at least about 50 MPa, and a Young's modulus from about 1.5 GPa to about 7.0 GPa.

17. The double sided conductive structure of claim 11 wherein the transparent polymer substrate comprises polysulfide, polysulfone, polyethylene naphthalate, or polyethersulfone.

18. The double sided conductive structure of claim 11 wherein each of the first and second sparse metal conductive layers comprises a fused metal nanostructured network and wherein the double sided conductive structure can be bent around a 1 mm diameter mandrel repeatedly for at least 200,000 times with the sheet resistance of the conductive surfaces changing by no more than 10%.

19. The double sided conductive structure of claim 11 wherein each surface of the double sided conductive structure has a sheet resistance of no more than about 75 ohm/sq.

20. The double sided conductive structure of claim 1 having an average thickness of no more than about 30 microns.

21. The double sided conductive structure of claim 1 wherein the first and/or second sparse metal conductive layers are patterned.

22. The double sided conductive structure of claim 1 wherein the first and/or second sparse metal conductive layers are independently patternable with UV light.

* * * * *